United States Patent
Matsueda et al.

(10) Patent No.: US 9,508,285 B2
(45) Date of Patent: Nov. 29, 2016

(54) PIXEL ARRAY, METAL MASK, ELECTRO OPTICAL DEVICE AND ELECTRIC APPARATUS

(71) Applicant: NLT Technologies, Ltd., Kanagawa (JP)

(72) Inventors: Yojiro Matsueda, Kanagawa (JP); Kenichi Takatori, Kanagawa (JP); Yoshihiro Nonaka, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 0 days.

(21) Appl. No.: 14/748,657

(22) Filed: Jun. 24, 2015

(65) Prior Publication Data

US 2015/0379924 A1 Dec. 31, 2015

(30) Foreign Application Priority Data

Jun. 26, 2014 (JP) ................................. 2014-130888

(51) Int. Cl.
*G09G 3/30* (2006.01)
*G09G 3/32* (2016.01)
*H01L 27/32* (2006.01)

(52) U.S. Cl.
CPC ............ *G09G 3/3208* (2013.01); *H01L 27/32* (2013.01); *H01L 27/3216* (2013.01); *H01L 27/3218* (2013.01); *G09G 2300/0426* (2013.01); *G09G 2300/0443* (2013.01); *G09G 2300/0452* (2013.01); *G09G 2300/0465* (2013.01); *G09G 2320/043* (2013.01); *H01L 27/326* (2013.01);
(Continued)

(58) Field of Classification Search
CPC ............ G09G 2320/0666; G09G 2300/0452; G09G 2300/043; G09G 2300/0465; G09G 3/2003; G09G 3/3208; G09G 3/2074; H01L 51/5203; H01L 27/3218; H01L 27/3213; H01L 27/3216; H01L 27/3211; H01L 27/3244
USPC .................. 345/76, 87, 55, 84, 88, 694, 589
See application file for complete search history.

(56) References Cited

U.S. PATENT DOCUMENTS

| | | | | |
|---|---|---|---|---|
| 5,563,621 A | * | 10/1996 | Silsby | G02F 1/133621 345/43 |
| 6,714,206 B1 | * | 3/2004 | Martin | G09G 3/2003 345/589 |
| 6,771,028 B1 | | 8/2004 | Winters | |

(Continued)

FOREIGN PATENT DOCUMENTS

| | | |
|---|---|---|
| JP | 2005-206881 | 8/2005 |
| JP | 2011-249334 | 12/2011 |

*Primary Examiner* — Jennifer Nguyen
(74) *Attorney, Agent, or Firm* — Young & Thompson

(57) ABSTRACT

In a pixel array in which rectangular pixels, each enclosing a subpixel of the first color (SP1) which has the highest luminosity factor, a subpixel of the second color (SP2) and a subpixel of the third color (SP3) which has the lowest luminosity factor, are two-dimensionally arranged, SP2 includes first and second portions respectively near two corners adjacent to each other in the first direction of the pixel, SP3 includes first and second portions near other two corners adjacent each other in the first direction of the rectangular pixel, and SP1 is located at a middle part including a center of gravity of the rectangular pixel. SP3 has a larger area than each of SP1 and SP2. In the second direction orthogonal to the first direction, SP2 and SP3 are widest near a pixel boundary in the first direction, SP1 is widest near the center of gravity in the pixel.

10 Claims, 41 Drawing Sheets

(52) U.S. Cl.
CPC ........ *H01L 27/3244* (2013.01); *H01L 27/3262* (2013.01); *H01L 2227/323* (2013.01)

(56) References Cited

U.S. PATENT DOCUMENTS

| | | | | |
|---|---|---|---|---|
| 8,179,365 B2* | 5/2012 | Lee | ................. | G09G 3/344 345/107 |
| 2002/0015110 A1* | 2/2002 | Brown | ................. | G09G 3/3607 348/589 |
| 2002/0186214 A1 | 12/2002 | Siwinski | | |
| 2003/0071943 A1* | 4/2003 | Choo | ................. | G02F 1/133514 349/106 |
| 2004/0113875 A1 | 6/2004 | Miller et al. | | |
| 2004/0201558 A1 | 10/2004 | Arnold et al. | | |
| 2005/0140907 A1* | 6/2005 | Yun | ................. | G02F 1/133514 349/144 |
| 2009/0302331 A1* | 12/2009 | Smith | ................. | H01L 27/3211 257/88 |
| 2011/0291550 A1 | 12/2011 | Kim et al. | | |

* cited by examiner

400

400

400

PIXEL ARRAY, METAL MASK, ELECTRO OPTICAL DEVICE AND ELECTRIC APPARATUS

CROSS-REFERENCE TO RELATED APPLICATIONS

This non-provisional application claims priority under 35 U.S.C.§119(a) on Patent Application No. 2014-130888 filed in Japan on Jun. 26, 2014, the entire contents of which are hereby incorporated by reference.

FIELD

The present invention relates to a pixel array, a metal mask, an electro optical device and an electric apparatus, and more specifically to an arrangement structure of subpixels in each pixel in a pixel array, a metal mask for realizing a pixel array with the arrangement structure, an electro optical device including a pixel array with the arrangement structure, and an electric apparatus utilizing the electro optical device as a display device.

BACKGROUND

Since an organic Electro Luminescence (EL) element is a self-light-emitting element of a current driven type, the need for a backlight is eliminated while the advantage of low power consumption, high viewing angle, high contrast ratio or the like is obtained; it is expected to perform well in the development of a flat panel display.

In an organic EL display device using such an organic EL element, subpixels of different colors of red (R), green (G) and blue (B) are used to constitute a large number of pixels, which makes it possible to display various kinds of color images. While these subpixels of R, G, and B (RGB) may be located in various different forms, they are generally arranged in stripes by equally placing subpixels of different colors (so-called RGB vertical stripe arrangement), as illustrated in FIG. 1. All colors can be displayed by adjusting the brightness among the three subpixels. In general, adjacent three subpixels of R, G and B are collectively regarded as one rectangular pixel, and such rectangular pixels are arranged in a square to realize a dot matrix display. In the display device of a dot matrix type, image data to be displayed has a matrix arrangement of n×m. A correct image can be displayed by associating the image data with each pixel one for one.

Furthermore, organic EL devices have different structures including a color filter type which creates the three colors of RGB with a color filter on the basis of a white organic EL element, and a side-by-side selective deposition type which applies different colors on the respective organic materials for the three colors of RGB. While the color filter type has a disadvantage in that the light use efficiency is lowered as the color filter absorbs light, resulting in higher power consumption, the side-by-side selective deposition type can easily have wider color gamut due to its high color purity and can have higher light use efficiency because a color filter is eliminated, thereby being widely used.

In the side-by-side selective deposition type, Fine Metal Mask (FMM) is used in order to individually color organic materials. It is, however, difficult to fabricate FMM because pitches thereof are made finer to be adapted for recent highly-refined organic EL display devices. To address such a problem, using the characteristics of human color vision, i.e. human eye being insensitive to R and B whereas sensitive to G, a pixel arrangement structure in which subpixels are constituted with two colors of G and B, or G and R, and a color expression requiring a subpixel of a missing color compared to the RGB arrangement is reproduced into a pseudo array by combining the two-color subpixels with an adjacent pixel having a subpixel of the missing color (so-called PenTile (registered trademark) arrangement) has been proposed (U.S. Pat. No. 6,771,028, US Patent Application Publication No. 2002/0186214, US Patent Application Publication No. 2004/0113875 and US Patent Application Publication No. 2004/0201558, for example).

The PenTile arrangement causes a dot width for R and B corresponding to two vertical stripes, reduces the number of subpixels, allows the aperture size of FMM to be larger and thus facilitates the manufacturing of a highly refined organic EL display device. However, the PenTile arrangement uses the tiling method to alleviate a color failure due to reduction in the number of subpixels, causing a jaggy in which curve lines of an image to be displayed smoothly are displayed in a staircase pattern, or a defect in which color changes are viewed as lines in an image with continuously changing color tone or luminance.

In the background as described above, as a pixel arrangement structure which can increase the dimension of a subpixel compared to the conventional RGB vertical stripe arrangement and which causes less degrading in display quality as in the PenTile arrangement, a pixel arrangement structure (so-called "S stripe arrangement") has been proposed in which R and G are located in the same column while B is located in the column subsequent to R and G, as well as in the row of R and G, as illustrated in FIG. 3 (Japanese Patent Application Laid-Open Publication No. 2011-249334, for example). This S stripe arrangement allows the width of a subpixel to be wider than that in the RGB vertical stripe arrangement, which can increase the aperture size of FMM and can also enhance the display quality compared to the PenTile arrangement because subpixels of RGB are located in one pixel.

SUMMARY

Since organic EL materials have different lifetime (aging speed) for colors of RGB and the organic EL material for B has the shortest lifetime, the colors lose balance over time, which shortens the lifetime of the display device. To address this problem, increasing the size of a subpixel of B may be conceivable in order to ensure a longer lifetime. Increasing the size of the subpixel of B, however, causes the subpixel of G to be out of the center of gravity in the pixel, generating a bias in the distribution of luminosity factors. The luminosity factors for RGB are generally higher in the order from G, R and B, meaning that G has a higher luminosity factor compared to R and B. Thus, as the position of the subpixel of G is out of the center of gravity, the luminosity factor will be the highest in the distribution of luminosity factors for RGB at a position displaced from the center of a pixel, which causes bias in the luminosity factors within the pixel.

Although such bias in the luminosity factors is not viewed at the inner side of an image, it becomes more obvious when the border of an image extends along the alignment direction of pixels, which causes such a phenomenon that the border of the image appears to be colored (so-called color edge), significantly degrading the display quality.

The present invention has been made in view of the circumstances as described above, and mainly aims to provide a pixel array which can extend the lifetime of a display device while enhancing the display quality, a metal mask for realizing the pixel array, an electro optical device including the pixel array, and an electric apparatus using the electro optical device as a display device.

According to one aspect of the present invention, a pixel array in which rectangular pixels are two-dimensionally arranged, a rectangular pixel encloses a subpixel of a first color which has a highest luminosity factor, a subpixel of a second color and a subpixel of a third color which has a lowest luminosity factor, wherein the subpixel of the second color includes a first portion and a second portion located respectively near two corners adjacent to each other in a first direction of the rectangular pixels, the subpixel of the third color includes a first portion and a second portion located near other two corners adjacent to each other in the first direction of the rectangular pixel, and the subpixel of the first color is located at a middle part including a center of gravity of the rectangular pixel. The subpixel of the third color has a larger area than each of the subpixels of the first color and the second color.

In a second direction orthogonal to the first direction, each of the subpixels of the second color and of the third color has the widest near a pixel boundary in the first direction, and the subpixel of the first color has the widest near the center of gravity in the pixel. Each of the subpixels has a structure including a light emitting material on an electrode.

For the first portions and the second portions of the subpixel of the second color and/or the subpixel of the third color, the light emitting material is isolated whereas the electrode is continuous.

In the first portion of the subpixel of the second color and/or the subpixel of the third color and in the second portion of a subpixel of a same color in an adjacent one of the pixels on a side of the first portion in the first direction, the light emitting material is continuous.

In the second portion of the subpixel of the second color and/or the subpixel of the third color and in the first portion of a subpixel of a same color in an adjacent one of the pixels on a side of the second portion in the first direction, the light emitting material is continuous. The electrode is isolated for each pixel.

The electro optical device according to one aspect of the present invention includes the pixel array and a circuit part driving the pixel array. The electric apparatus according to one aspect of the present invention includes, as a display device, an organic electroluminescence device in which the pixel array constituted by an organic electroluminescence element and a circuit part driving the pixel array are formed on a flexible substrate.

According to one aspect of the present invention, a metal mask used in formation of a pixel array on a substrate is provided. The pixel array is so configured that rectangular pixels are two-dimensionally arranged, a rectangular pixel encloses a subpixel of a first color which has a highest luminosity factor, a subpixel of a second color and a subpixel of a third color which has a lowest luminosity factor.

The subpixel of the second color includes a first portion and a second portion separated from each other and located respectively near two corners adjacent to each other in a first direction of the rectangular pixels, the subpixel of the third color includes a first portion and a second portion separated from each other and located near other two corners adjacent to each other in the first direction of the rectangular pixel, and the subpixel of the first color is located at a middle part including a center of gravity in the rectangular pixel.

The metal mask for forming a film of a light emitting material of the first color has an aperture corresponding to each subpixel of the first color.

The metal mask for forming a film of a light emitting material of the second color and/or the third color has one aperture for the first portion of the subpixel of the second color and/or the first portion of the subpixel of the third color and for the second portion of a subpixel of a same color in an adjacent one of the pixels on a side of the first portion in the first direction, and has one aperture for the second portion of the subpixel of the second color and/or the second portion of the subpixel of the third color and for the first portion of a subpixel of a same color in an adjacent one of the pixels on a side of the second portion in the first direction.

In a pixel array according to the present invention, a subpixel of R is located near two adjacent corners of a rectangular pixel, a subpixel of B is located near other two adjacent corners of the rectangular pixel, and a subpixel of G is located in a middle part including the center of gravity of the rectangular pixel. While the subpixel of B has a larger area than that of the subpixel of R, each of the subpixel of B and subpixel of R is widest near a boundary of the pixel, and the subpixel of G is widest near the center of gravity in the pixel and the size of the subpixel of B having the shortest lifetime increases to allow the electro optical device to have a longer lifetime while suppressing bias in luminosity factors. Thus, it is possible to suppress coloring of a border of an image and to enhance the display quality in an electro optical device using a pixel array having such a pixel arrangement structure or an electric apparatus using the electro optical device as a display device.

Furthermore, in the case where the subpixel of R and/or the subpixel of B are separated in a pixel, the subpixels in the adjacent pixels may share an aperture of a metal mask, which can ensure the maximum aperture ratio and can facilitate fabrication of a metal mask or manufacturing of a display device.

The above and further objects and features of the invention will more fully be apparent from the following detailed description with accompanying drawings.

DETAILED DESCRIPTION

Figure 1:
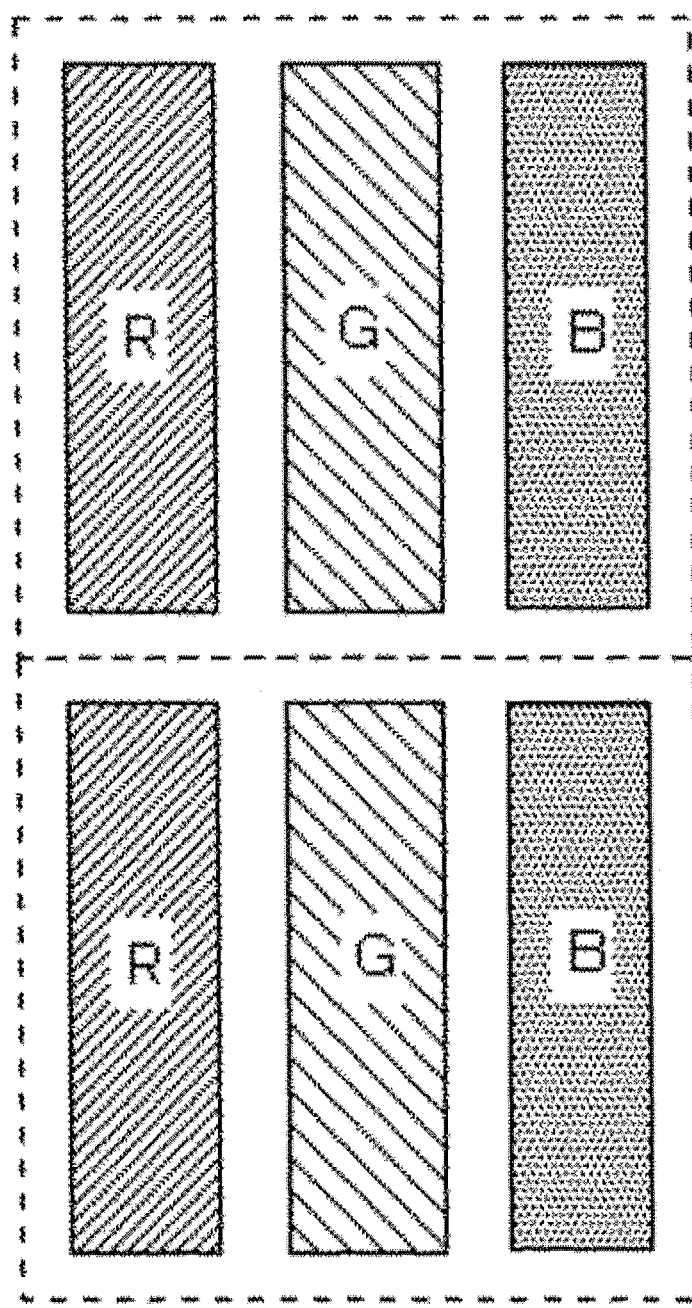
FIG. 1 is a plan view schematically illustrating a pixel arrangement structure (RGB vertical stripe arrangement) of the conventional organic EL display device.
Figure 2:
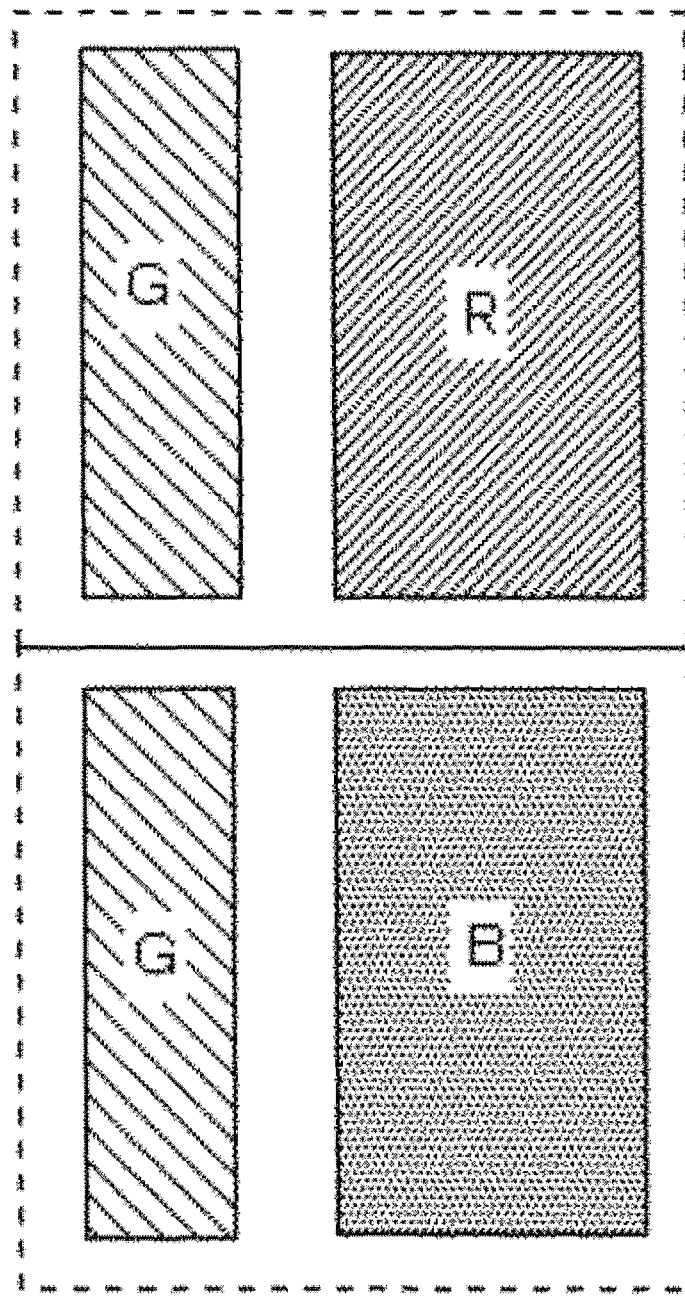
FIG. 2 is a plan view schematically illustrating a pixel arrangement structure (PenTile arrangement) of the conventional organic EL display device.
Figure 3:
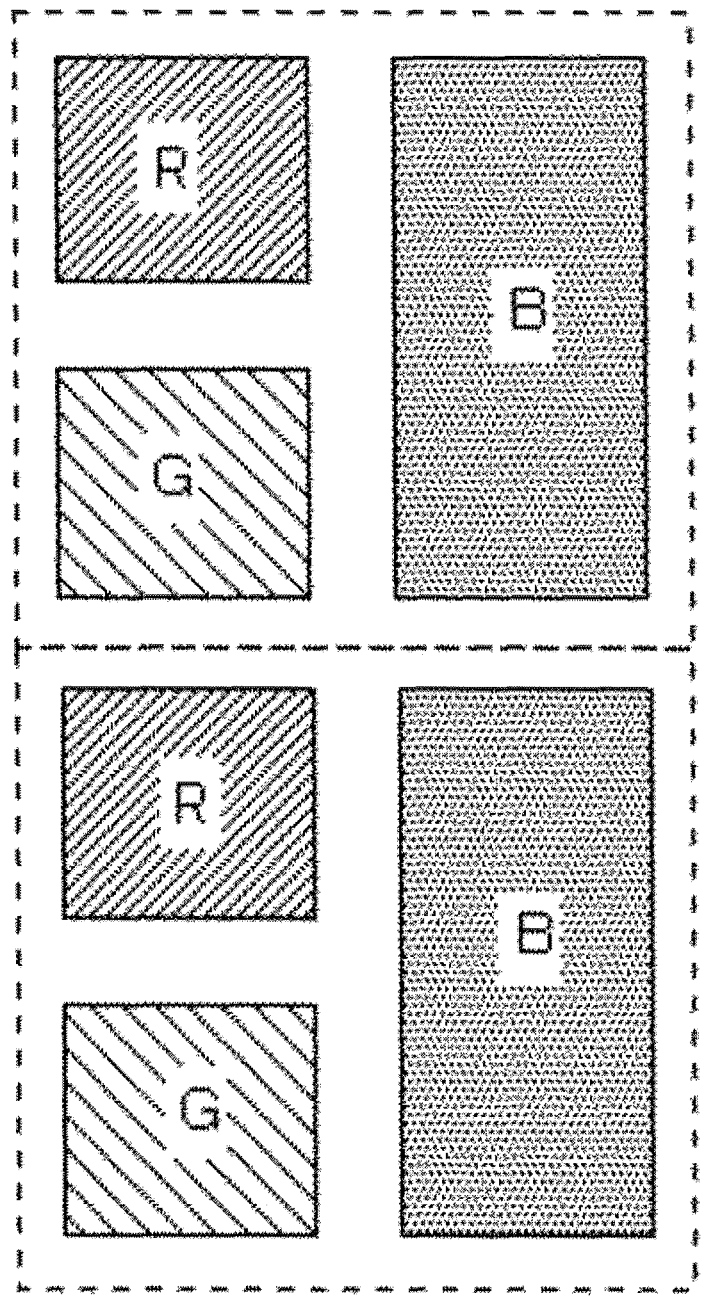
FIG. 3 is a plan view schematically illustrating a pixel arrangement structure (S stripe arrangement) of the conventional organic EL display device.

As described above, organic EL materials for RGB colors have different periods of lifetime (aging speed), and the organic EL material for B has the shortest lifetime. More specifically, the luminescent color of B has a larger band gap compared to the other luminescent colors, the molecular structure thereof having a small conjugate system, making a molecule itself vulnerable. In particular, a phosphorescent material has high excited triplet energy, which makes it susceptible to a minute amount of quencher present in the system. Moreover, the host material for holding a luminescence material requires even higher excited triplet energy. As the lifetime of the organic EL material for B is short, the colors lose their balance over time, resulting in a shorter lifetime of a display device.

To address this problem, increasing the size of a subpixel of B may be conceived in order to ensure a longer lifetime. Increasing the size of the subpixel of B, however, causes the subpixel of G which has the highest luminosity factor to be out of the center of gravity in a pixel, making the luminosity factor highest at a position displaced from the center of a pixel in the distribution of luminosity factors for RGB. This results in a bias of luminosity factors in the pixel, causing a problem of degraded display quality due to generation of a color edge.

In view of the above, according to an embodiment of the present invention, the location and shapes of subpixels are so devised that the subpixel of G is not out of the center of gravity in a pixel while increasing the size of the subpixel of B, so as to ergonomically improve the color recognition of a fine pattern. For example, the subpixel of R is located near two adjacent corners of a rectangular pixel, the subpixel of B is located near other two adjacent corners of the rectangular pixel and the subpixel of G is located at a middle part of the rectangular pixel, while the subpixel of B is made to have a larger area than the subpixel of R, each of the subpixels of B and R is made to have the widest near an end of the pixel and the subpixel of G is made to have the widest near the center of gravity of the pixel.

Further, the subpixels of R and the subpixels of B may have a structure in which at least one pair of subpixels is connected or at least the other pair of subpixels is separated. Even if the structure of the subpixels being separated in a pixel (structure having two subpixel pieces) is employed, the same signal needs to be inputted to the two subpixel pieces. It is thus necessary to devise the shape, routing and contact positions for organic EL layers and electrodes (lower electrode). For example, for two subpixel pieces, the organic EL layer may be separated while the lower electrode is continuous in a pixel.

Furthermore, in the case where a subpixel is separated in a pixel, the size of an aperture of FMM for forming a film of the organic EL layer is reduced, making it difficult to fabricate FMM. In the case where the structure with the subpixels of R and/or B are separated in the pixel is employed, the aperture of FMM for R and/or B are unified between adjacent pixels to increase the size thereof in order to easily fabricate a metal mask for realizing the pixel arrangement structure, to facilitate the fabrication of FMM. Here, the film of organic EL material is formed across the adjacent two pixels, while the lower electrodes in different pixels are separated from one another and the organic EL material at a portion without the lower electrode would not contribute to emission of light, thereby avoiding an adverse effect which may be caused by unifying the aperture of FMM.

It is thus possible to ensure a longer lifetime and to suppress color variation by increasing the area of the subpixel of B as much as possible, so that full white or full black can be displayed. Moreover, locating the subpixel of G as close as possible to the center of a pixel can suppress the occurrence of a color edge even if a pattern of any shape is displayed, thereby ergonomically enhancing the color recognition of a fine pattern. Furthermore, sharing an aperture between subpixels in adjacent pixels can secure the maximum aperture ratio and facilitate fabrication of a metal mask or manufacturing of a display device.

The present invention will be described below with reference to the drawings. It is to be noted that an electro optical element means a general electron element which changes the optical state of light by an electric action, and includes, in addition to a self-light-emitting element such as an organic EL element, an electron element such as a liquid-crystal element which changes the polarization state of light to implement gradation display. Furthermore, an electro optical device means a display device utilizing an electro optical element for display. Since an organic EL element is suitable in the present invention and the use of an organic EL element can obtain a current-driven light emitting element which allows self-light emission when driven with current, an organic EL element is given as an example in the description below.

Figure 4:
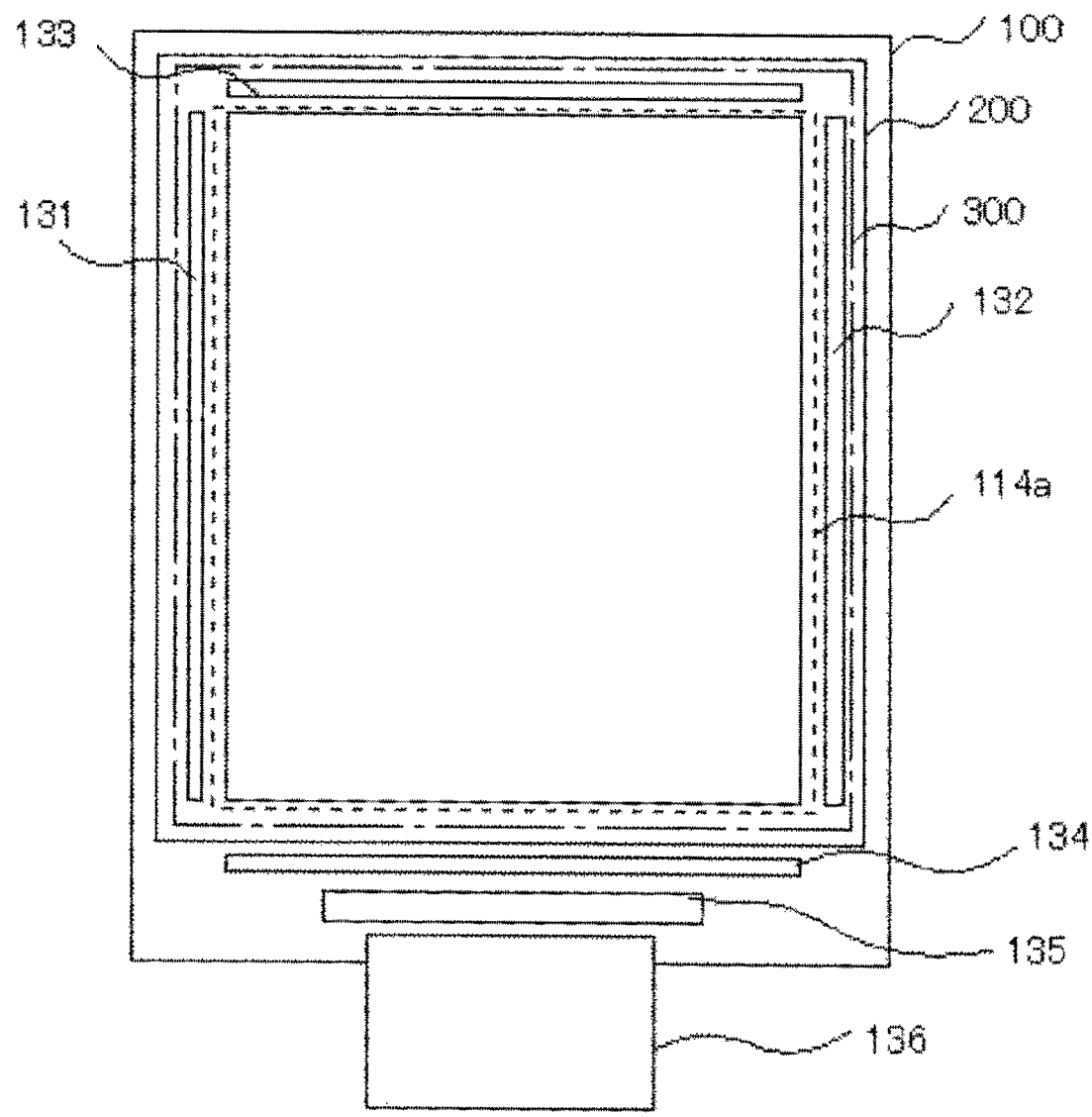
FIG. 4 is a plan view illustrating an organic EL display device according to an embodiment of the present invention.

FIG. 4 illustrates an organic EL display device as an example of an electro optical device according to the present invention. The organic EL display device includes, as main components, a thin film transistor (TFT) substrate 100 on which a light emitting element is formed, a sealing glass substrate 200 which seals the light emitting element, and a bonding means (glass frit seal part) 300 which bonds the TFT substrate 100 to the sealing glass substrate 200. Moreover, around a cathode electrode forming region 114a outside the display region of the TFT substrate 100 (active matrix section), for example, a scanning driver 131 (TFT circuit) which drives a scanning line on the TFT substrate 100, an emission control driver 132 (TFT circuit) which controls the light emission period of each pixel, a data line electro static discharge (ESD) protection circuit 133 which prevents damage caused by electrostatic discharge, a demultiplexer (1:n DeMUX 134) which returns a stream at a high transfer rate to multiple streams at a former low transfer rate, a data driver IC135 which is mounted using an anisotropic conductive film (ACF) and which drives a data line, are located. The organic EL display device is connected with an external device through a flexible printed circuit (FPC) 136. Since FIG. 4 is a mere example of an organic EL device according to the present embodiment, the shape and configuration thereof may appropriately be modified.

Figure 5:
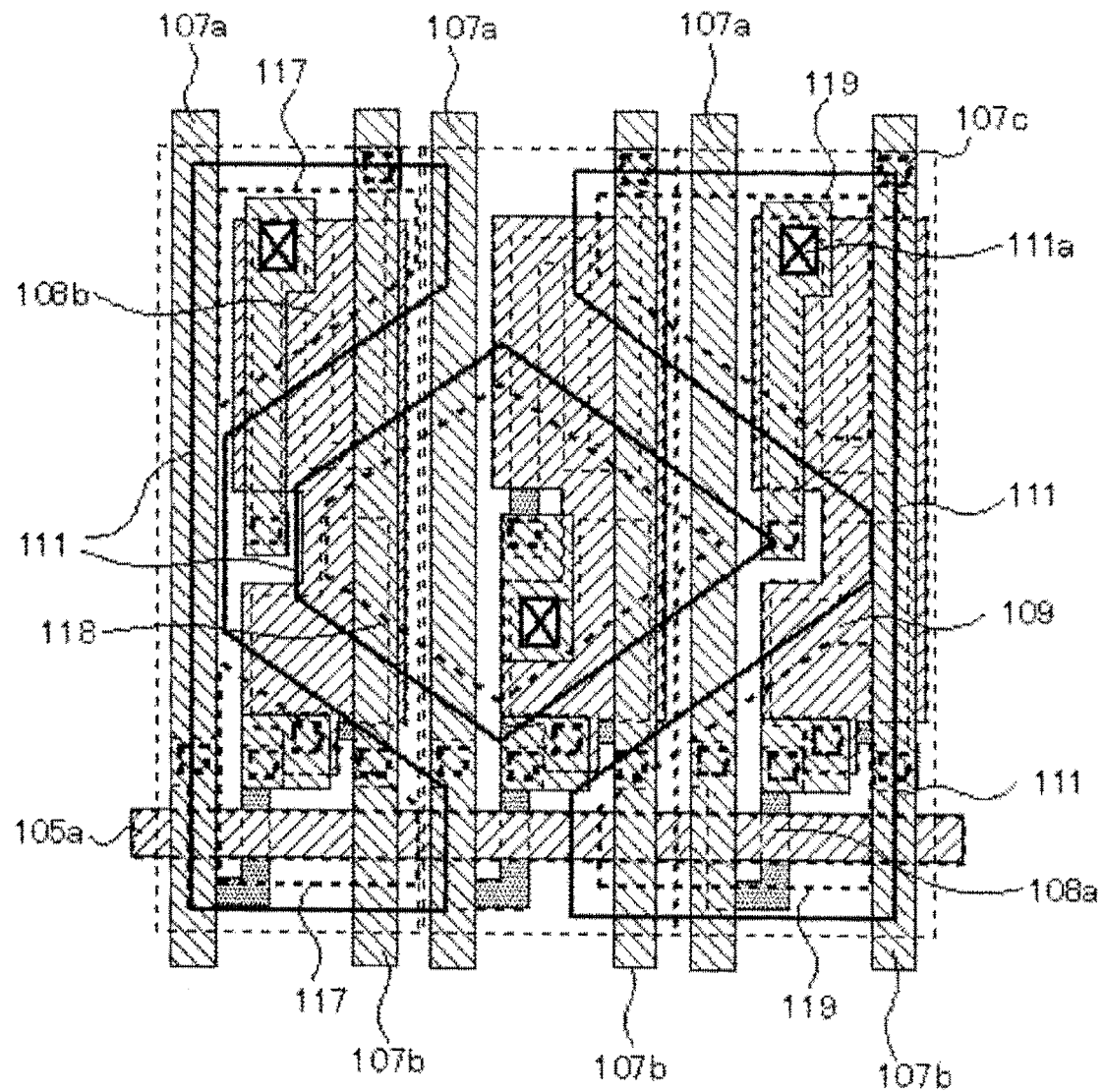
FIG. 5 is a plan view schematically illustrating a configuration of a pixel (corresponding to three subpixels) in an organic EL display device according to an embodiment of the present invention.
Figure 6:
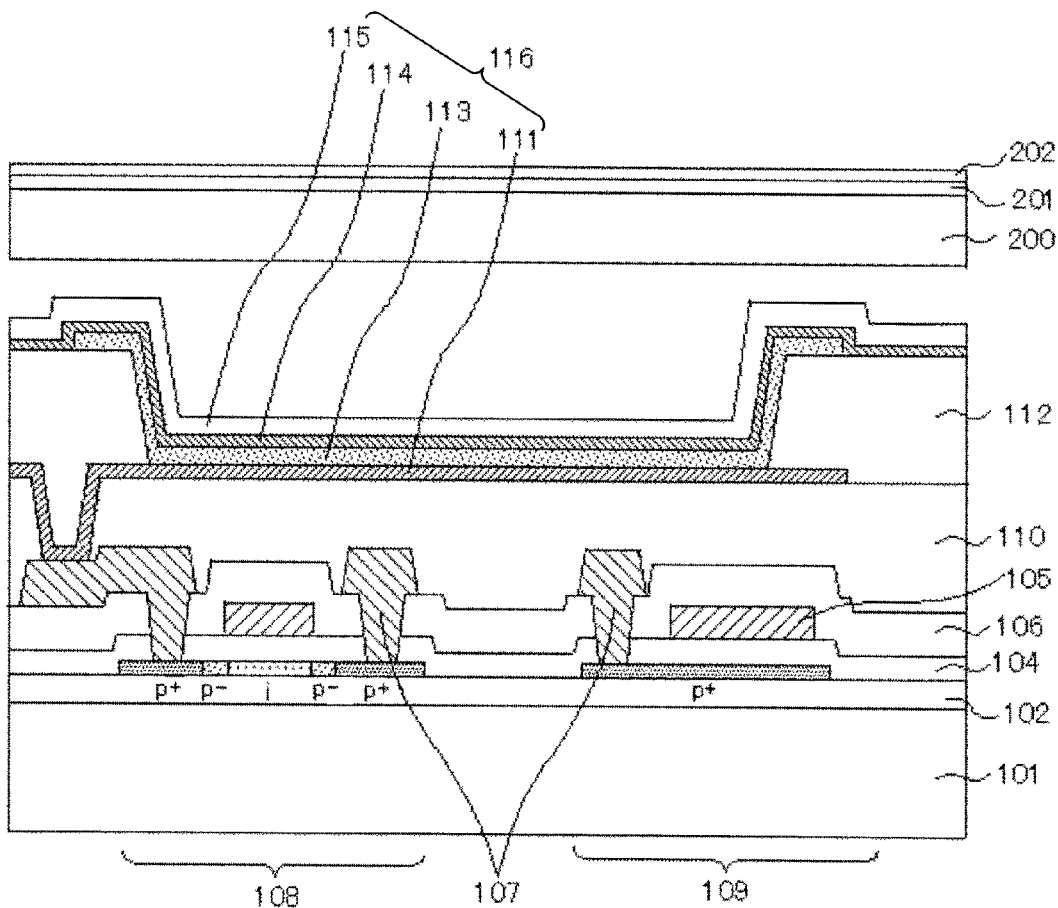
FIG. 6 is a section view schematically illustrating a configuration of a pixel (corresponding to one subpixel) in an organic EL display device according to an embodiment of the present invention.

FIG. 5 is a plan view specifically illustrating one pixel (three subpixels) in a light emitting element formed on the TFT substrate 100, and the pixel is repeatedly formed in the extending direction of data line and the extending direction of scanning line (gate electrode). FIG. 6 is a section view specifically illustrating one subpixel. In FIG. 6, for clarifying the structure of a subpixel according to the present embodiment, the regions of a TFT part 108b (M2 drive TFT) and a retention capacitance part 109 in the plan view of FIG. 5 are taken out and simplified for their illustration.

The TFT substrate 100 is constituted by: a poly silicon layer 103 made of low-temperature poly silicon (LTPS) or the like formed on a glass substrate 101 through an underlying insulation film 102; a first metal layer 105 (a gate electrode 105a and a retention capacitance electrode 105b) formed through a gate insulation film 104; a second metal layer 107 (a data line 107a, a power supply line 107b, a source/drain electrode, a first contact part 107c) connected to the poly silicon layer 103 through an aperture formed at an interlayer insulation film 106; and a light emitting element 116 (an anode electrode 111, an organic EL layer 113, a cathode electrode 114 and a cap layer 115) formed through a planarization film 110.

Dry air is enclosed between the light emitting element 116 and the sealing glass substrate 200, which is then sealed by the glass frit seal part 300, to form an organic EL display device. The light emitting element 116 has a top emission structure, in which the light emitting element 116 and the sealing glass substrate 200 are set to have a predetermined space between them while a λ/4 retardation plate 201 and a polarization plate 202 are formed on the side of the light emitting surface of the sealing glass substrate 200, so as to suppress reflection of light entering from the outside.

In FIG. 5, one pixel is constituted by three regions, each of which is placed between the data line 107a and the power supply line 107b opposed to each other, and has an M1 switch TFT 108a, an M2 drive TFT 108b and a retention capacitance part 109. Here, in the case of the pixel arrangement structure of RGB vertical stripe arrangement, the anode electrode 111 is formed by being divided into the three regions described above, and the M1 switch TFT 108a, M2 drive TFT 108b and retention capacitance part 109 in each region are used to drive the light emitting element 116 formed in the region. In the present embodiment, however, in order to realize the structure with the subpixels of R and/or B being separated in the pixel, the light emitting region 117 for the subpixel of R as well as the light emitting region 119 for the subpixel of B are each divided into two regions, while the anode electrode 111 in each of the subpixel of R and the subpixel of B is formed to cross the two divided light emitting regions.

More specifically, as for the subpixel of B which has the lowest luminosity factor, the organic EL layer for B is formed to be divided into an upper part and a lower part mainly in the region between the data line 107*a* and the power supply line 107*b* for B, while the anode electrode 111 (thick solid line in FIG. 5) is so formed as to link the two organic EL layers, and is connected to the TFT part 108*b* (M2 drive TFT) in the region through the second contact part 111*a* on the upper right in the figure. This allows the two light emitting regions 119 for B (thick broken line in FIG. 5) on the upper right and lower right in the figure to emit light at the same time.

Also for the subpixel of R, the organic EL layer for R is formed to be divided into an upper part and a lower part mainly in the region between the data line 107*a* and the power supply line 107*b* for R, while the anode electrode 111 is formed to link the two organic EL layers and is connected to the TFT part 108*b* (M2 drive TFT) in the region through the second contact part 111*a* on the upper left in the figure. This allows the two light emitting regions 117 for R on the upper left and lower left in the figure to emit light at the same time.

Furthermore, as for the subpixel of G which has the highest luminosity factor, the organic EL layer for G and the anode electrode 111 are formed mainly in the region between the data line 107*a* and the power supply line 107*b*, while the anode electrode 111 is connected to the TFT part 108*b* (M2 drive TFT) in the region through the second contact part 111*a* located at substantially the middle in the figure.

It is to be noted that the color having the highest luminosity factor and the color having the lowest luminosity factor as described in the present specification and claims have relative meanings, indicating "highest" and "lowest" in a comparison among multiple subpixels included in one pixel. Furthermore, the M1 switch TFT 108*a* is formed to have a dual gate structure as illustrated so as to suppress crosstalk from the data line 107*a*, and the M2 drive TFT 108*b* which converts voltage into current is formed to have a routed shape as illustrated in order to minimize the variation in the manufacturing process, thereby ensuring a sufficient channel length. Furthermore, the gate electrode of the drive TFT is extended to be used as an electrode of the retention capacitance part 109 so as to ensure sufficient retention capacitance with a limited area. Such a pixel structure allows the colors of RGB to have larger light emitting regions, making it possible to lower the current density per unit area of each color for obtaining necessary luminance, and to extend the lifetime of a light emitting element.

While FIG. 6 illustrates a top emission structure in which light radiated from the light emitting element 116 is directed to the outside through the sealing glass substrate 200, a bottom emission structure may also be possible in which the light is radiated to the outside through the glass substrate 101.

Figure 7:
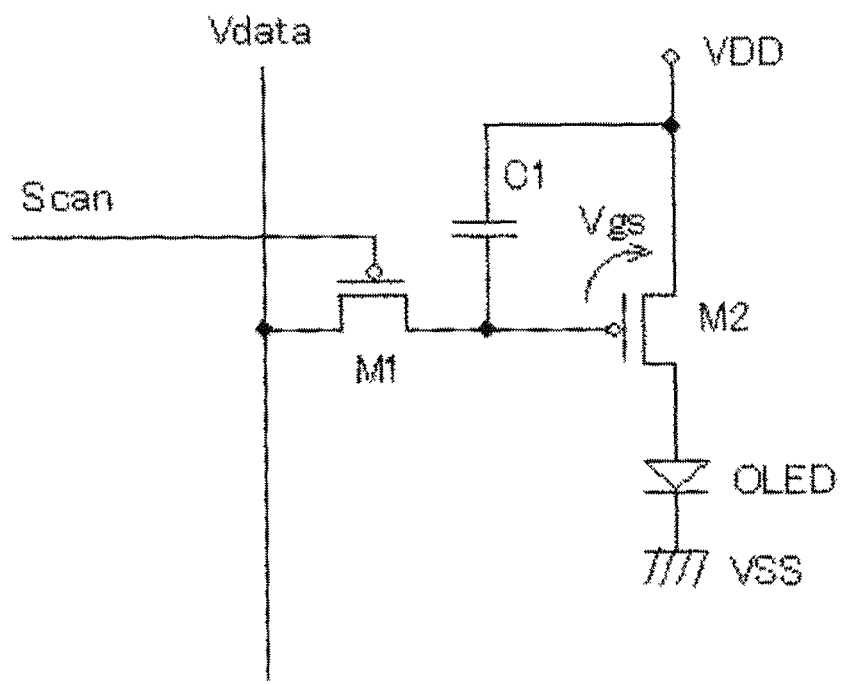
FIG. 7 is a main circuit configuration diagram of a pixel in an organic EL display device according to an embodiment of the present invention.
Figure 8:
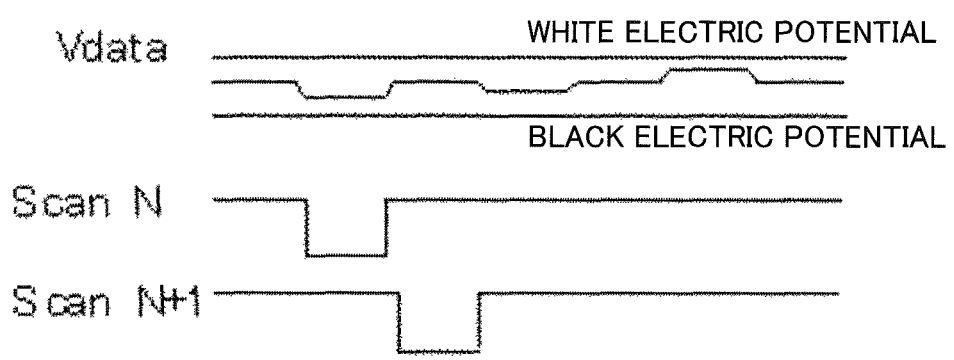
FIG. 8 is a waveform illustration of a pixel in an organic EL display device according to an embodiment of the present invention.
Figure 9:
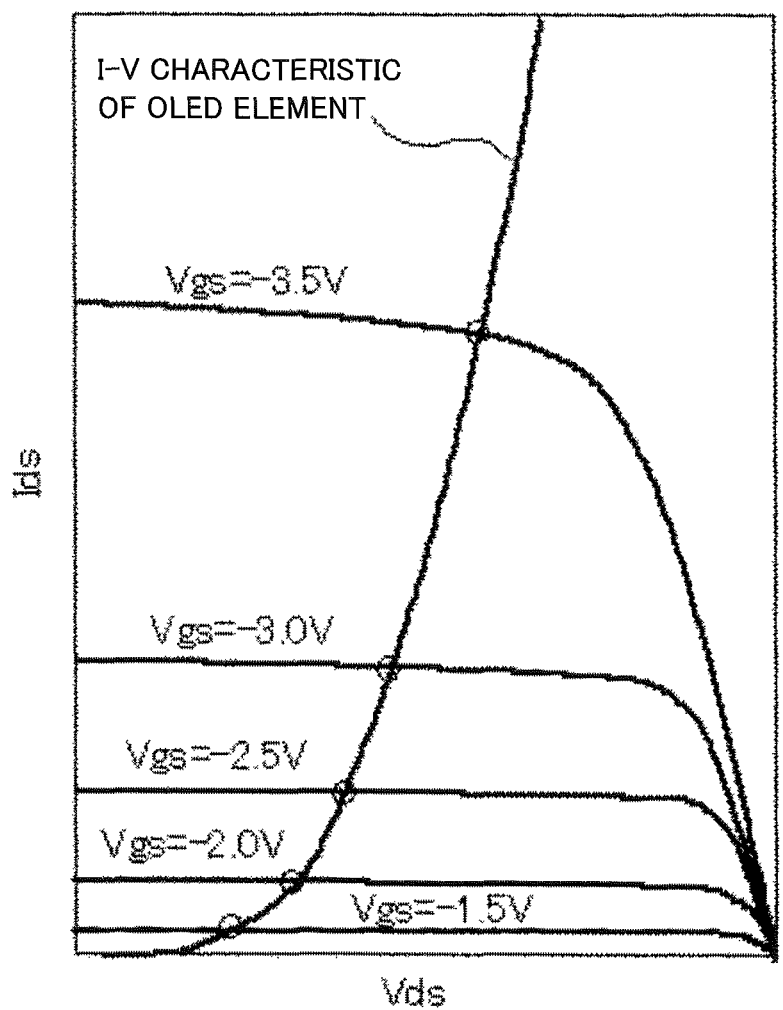
FIG. 9 is an output characteristic diagram of a drive TFT in an organic EL display device according to an embodiment of the present invention.

Next, a method of driving each subpixel will be described with reference to FIG. 7 to FIG. 9. FIG. 7 is a main circuit configuration diagram of a subpixel, FIG. 8 is a waveform and FIG. 9 illustrates an output characteristic of a drive TFT. Each subpixel is configured by including the M1 switch TFT, M2 drive TFT, C1 retention capacitance and light emitting element (OLED), and is drive-controlled with a two-transistor system. The M1 switch TFT is a p-channel field effect transistor (FET), the gate terminal of which is connected to a scanning line (Scan) and the drain terminal of which is connected to a data line (Vdata). The M2 drive TFT is a p-channel FET, the gate terminal of which is connected to the source terminal of the M1 switch TFT. Moreover, the source terminal of the M2 drive TFT is connected to the power supply line (VDD), whereas the drain terminal thereof is connected to the light emitting element (OLED). Furthermore, a C1 retention capacitance is formed between the gate and the source of the M2 drive TFT.

In the configuration described above, when a selection pulse is outputted to the scanning line (Scan) to make the M1 switch TFT in an open state, the data signal supplied through the data line (Vdata) is written into the C1 retention capacitance as a voltage value. The retention voltage written into the C1 retention capacitance is held over a period of one frame, the retention voltage causing the conductance of the M2 drive TFT to change in an analog manner, to supply forward bias current, corresponding to a gradation level of light emission, to the light emitting element (OLED).

As described above, since the light emitting device (OLED) is driven with constant current, the luminance of emitted light may be maintained to be constant despite a possible change in the resistance due to degrading of the light emitting device (OLED), which is thus suitable for a method of driving an organic EL display device according to the present embodiment.

Next, the pixel arrangement structure of the organic EL display device with the structure above will now be described with reference to FIG. 10 to FIG. 16. Note that the subpixels of RGB illustrated in FIG. 10 to FIG. 16 indicate the light emission region serving as light emitting elements (a portion where the organic EL layer 113 is placed between the anode electrode 111 and the cathode electrode 114 in FIG. 6, i.e. the portion of a bank layer from which the element separation film 112 is removed), not the region where the organic EL layer 113 is formed. Furthermore, the border (solid line) of a pixel in FIG. 10 to FIG. 16 is not defined by components of the TFT substrate 100 but by the relationship between sets of adjacent subpixels in the case where a set of subpixels are repeatedly located, and forms a rectangular shape here, though not necessarily limited to a rectangle. The center of gravity of a pixel in the present specification and claims does not correspond to the center of gravity of this rectangle illustrated here but to the center of gravity of a minimum rectangle enclosing the subpixel of the first color (subpixel of G), the subpixel of the second color (subpixel of R) and the subpixel of the third color (subpixel of B), i.e. the position at which the two diagonal lines in the minimum rectangle cross each other.

Figure 10:
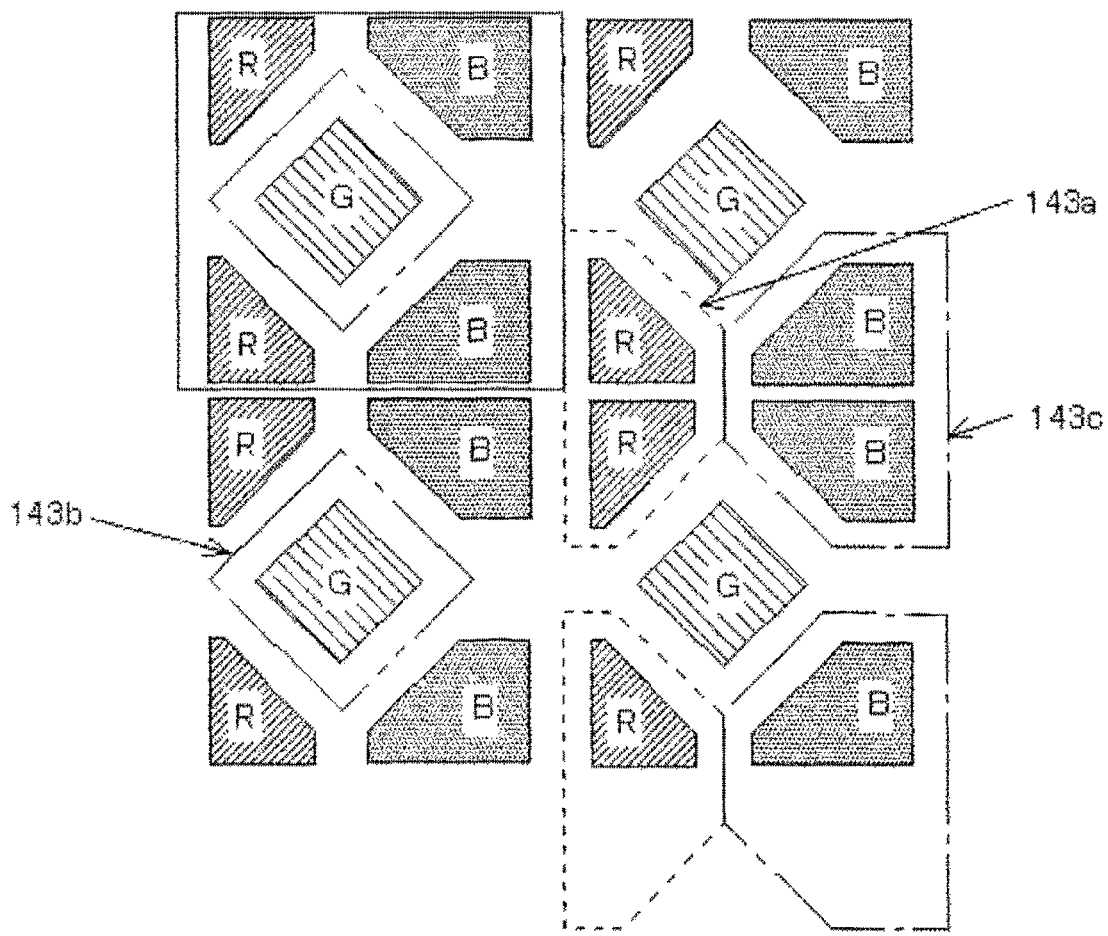
FIG. 10 is a plan view illustrating a pixel arrangement structure according to an embodiment of the present invention.

As illustrated in FIG. 10, in the pixel arrangement structure according to the present embodiment, subpixels of R (the first portion on the upper left and the second portion on the lower left) are located at adjacent two corners (two corners on the left side in the figure) among the four corners of a rectangular pixel, subpixels of B which has the lowest luminosity factor (the first portion on the upper right and the second portion on the lower right) are located at the other adjacent two corners (two corners on the right side in the figure) among the four corners of the pixel, and a subpixel of G which has the highest luminosity factor is located in the middle of the pixel. That is, each pixel is constituted by five subpixels including two subpixels of R, two subpixels of B and one subpixel of G. As for the size of the areas of the subpixels, in view of the luminosity factors for the respective colors of RGB, the expression of subpixel of G<two subpixels of R<two subpixels of B is satisfied.

In the pixel arrangement structure as described above, the organic EL materials for R and B are separately formed, while the anode electrode 111 is formed to link two subpixels of R and B as illustrated in FIG. 5, so that the same signal is applied to the two subpixels of R and to the two subpixels of B respectively. Furthermore, in the case of the pixel arrangement structure as described above, if an aperture corresponding to each subpixel is formed on FMM for evaporating the organic EL material, the size of the aperture (particularly the aperture for the subpixels of R and B) will be small, making it difficult to fabricate FMM. Thus, the aperture for the subpixels of R and B are unified with the aperture for the subpixels of the same color in an adjacent pixel, to increase the size of the aperture (not illustrated for all pixels in the figure for easy recognition of apertures). More specifically, in the case where two subpixels of R and two subpixels of B are located in the vertical direction in the drawing as illustrated in FIG. 10, the aperture for the subpixel of R on the upper left (first portion) is unified with the aperture for the subpixel of R on the lower left (second portion) in the adjacent pixel on the upper side, while the aperture for the subpixel of R on the lower left (second portion) is unified with the aperture for the subpixel of R on the upper left (first portion) in the adjacent pixel on the lower side, to form an R aperture 143a (see the broken line in the figure). Likewise, the aperture for the subpixel of B on the upper right (first portion) is unified with the aperture for the subpixel of B on the lower right (second portion) in the adjacent pixel on the upper side, while the aperture for the subpixel of B on the lower right (second portion) is unified with the aperture for the subpixel of B on the upper right (first portion) in the adjacent pixel on the lower side, to form a B aperture 143c (see the dashed-and-dotted line in the figure). Accordingly, the number of apertures is three for one pixel, which can avoid the difficulty in fabricating FMM. If an organic EL material is evaporated through the R aperture 143a or B aperture 143c, the organic EL material itself is formed to cross adjacent pixels. The anode electrode is, however, separated for each pixel and the portion without the anode electrode does not contribute to light emission, so that the subpixels of R and subpixels of B are separated as illustrated in the figure.

It is to be noted that the shapes and location for the two subpixels of R, two subpixels of B and one subpixel of G illustrated in FIG. 10 are mere examples and can appropriately be modified. It is, however, preferable to form each of the two subpixels of R, the two subpixels of B and the subpixel of G to have a symmetrical shape with respect to the line passing the center of gravity of the rectangular pixel (horizontal line here) in order to suppress bias in luminosity factors.

Figure 11:
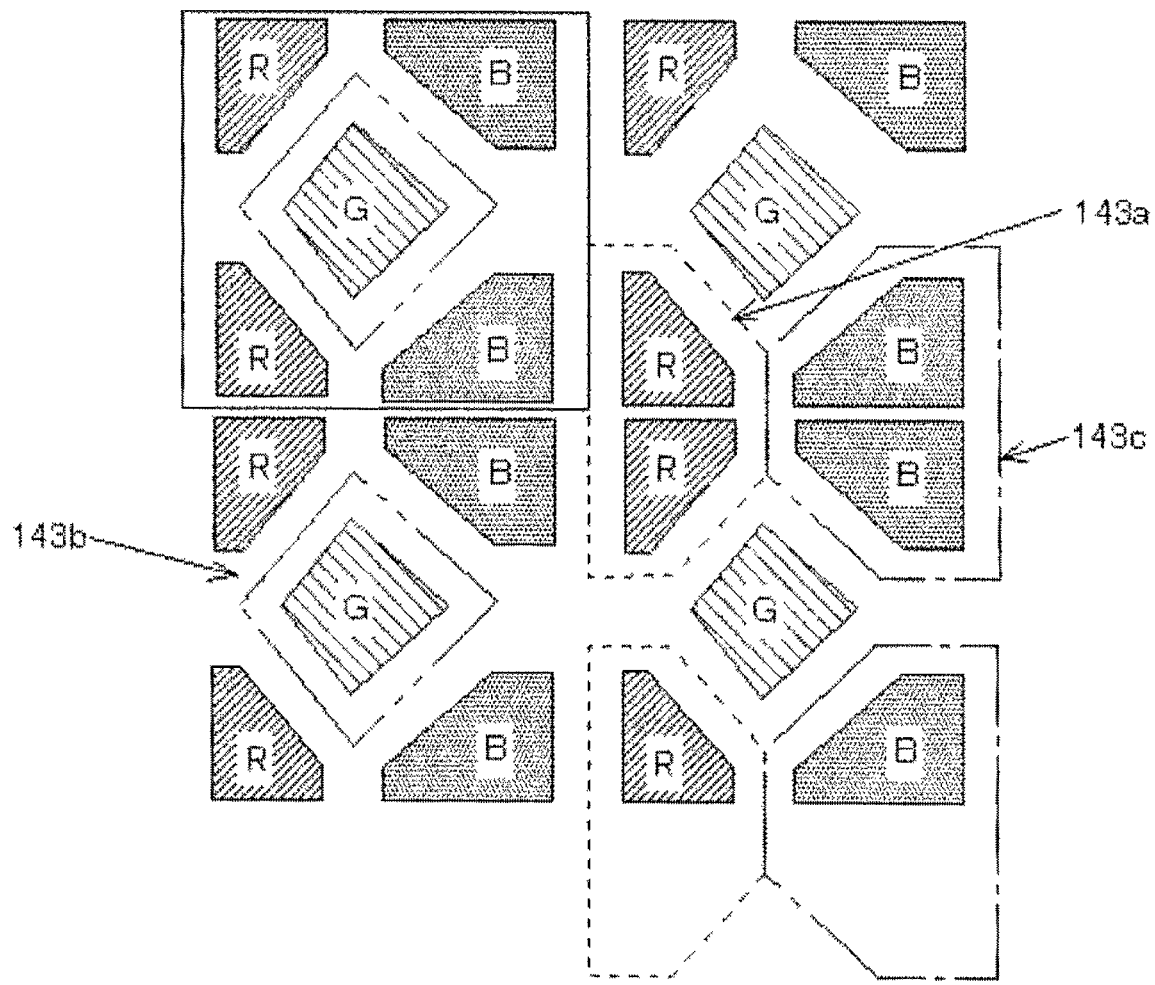
FIG. 11 is a plan view illustrating another example of a pixel arrangement structure according to an embodiment of the present invention.

Furthermore, while the subpixel of G has a diamond shape in FIG. 10, the rims of the subpixel of G may form such a shape that the rims of the adjacent subpixels of R or B that are opposite thereto have a substantially constant distance from the rims of the subpixel of G. For example, as illustrated in FIG. 11, in the case where the inclination angles of the rims of the subpixels of R and B on the side of the center of the pixel are different from each other, the subpixel of G may have a diamond shape modified according to the inclinations. In the configuration of FIG. 11, as the center of gravity of the subpixel of G is made closer to the center of gravity of the pixel, it is possible to correct the bias in the luminosity factors for the entire pixel.

Figure 12:
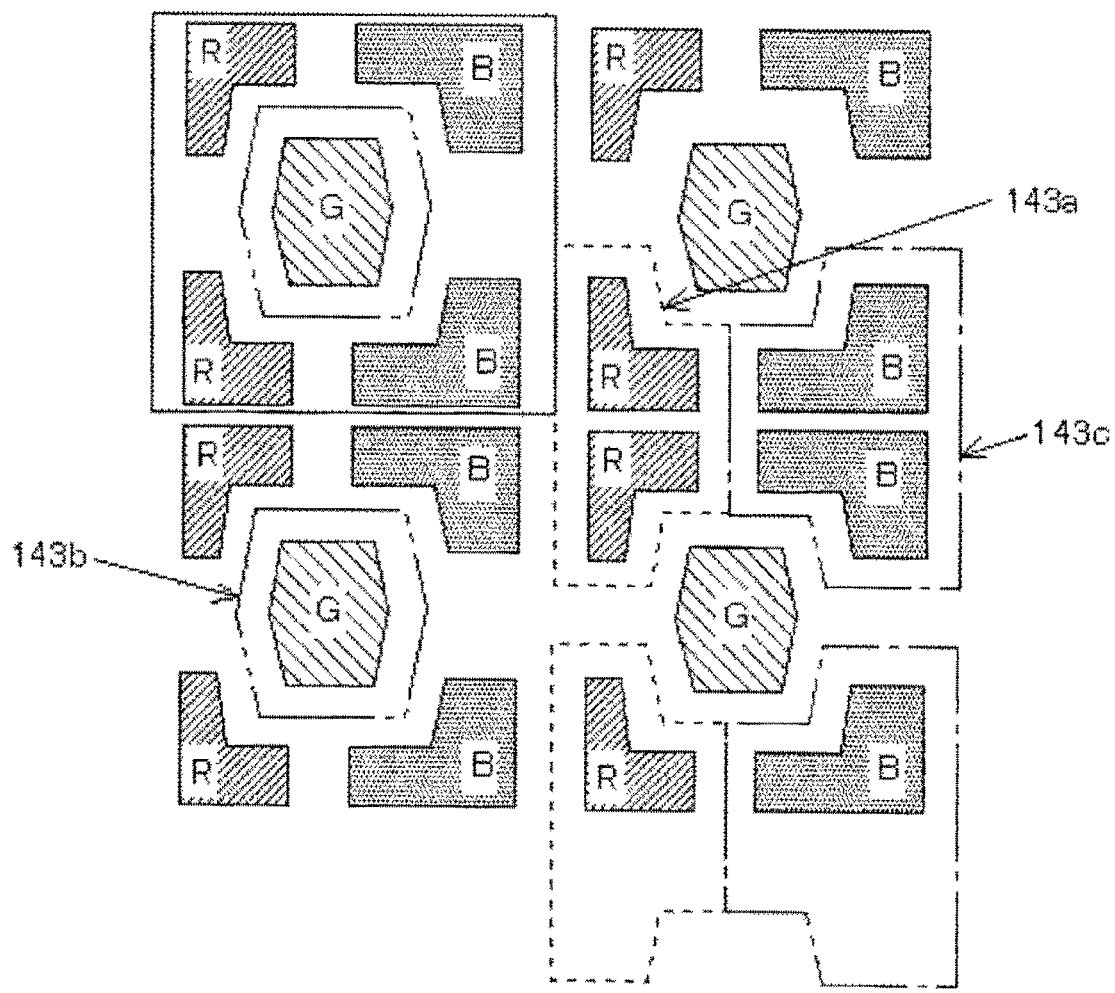
FIG. 12 is a plan view illustrating another example of a pixel arrangement structure according to an embodiment of the present invention.
Figure 13:
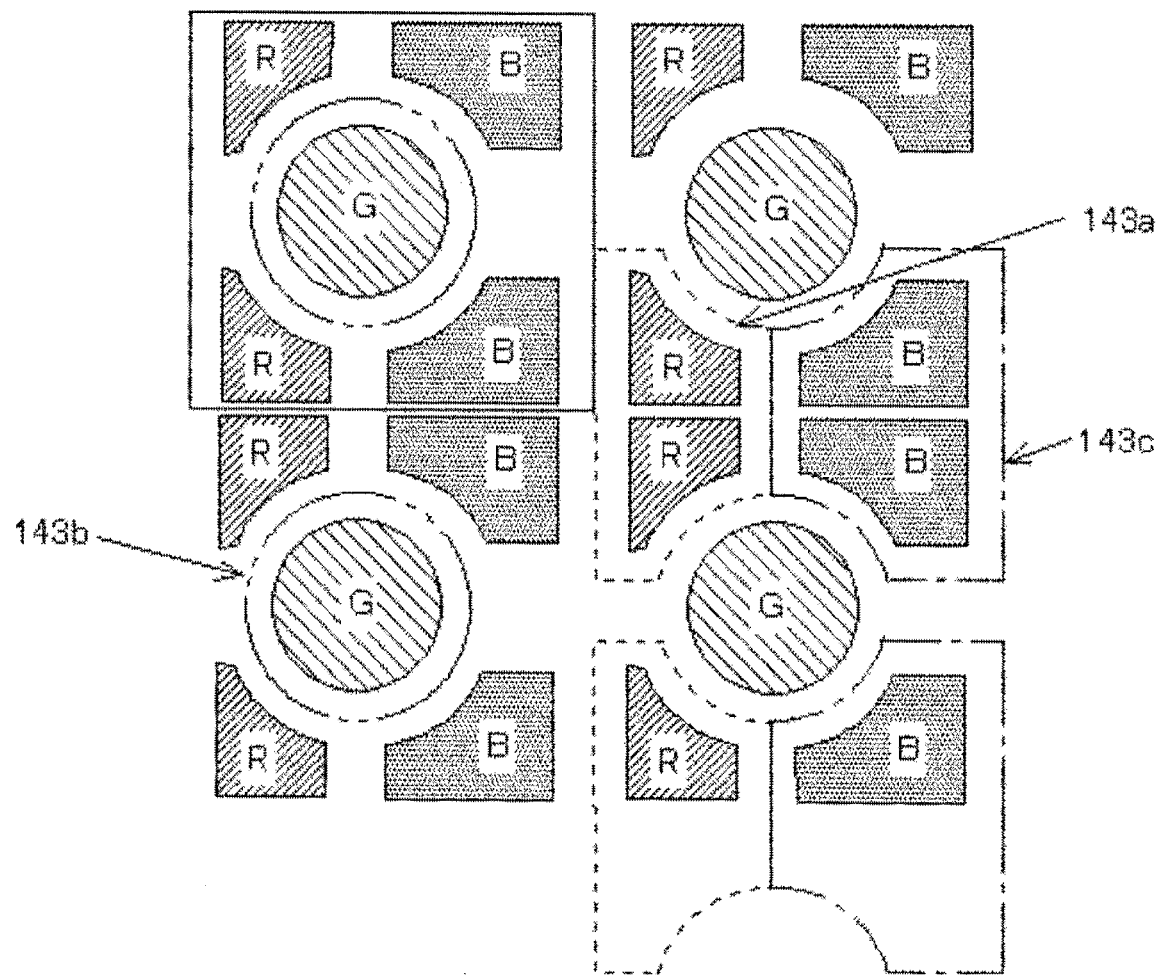
FIG. 13 is a plan view illustrating another example of a pixel arrangement structure according to an embodiment of the present invention.

Furthermore, as illustrated in FIG. 12, in the case where the rims of the subpixels of R and B on the side of the pixel center have stepped shapes, the subpixel of G may be formed in a hexagonal or an octagonal shape. Furthermore, as illustrated in FIG. 13, in the case where the rims of the subpixels of R and B on the side of the pixel center are curved, the subpixel of G may be formed in a circular or an ellipsoidal shape.

Figure 14:
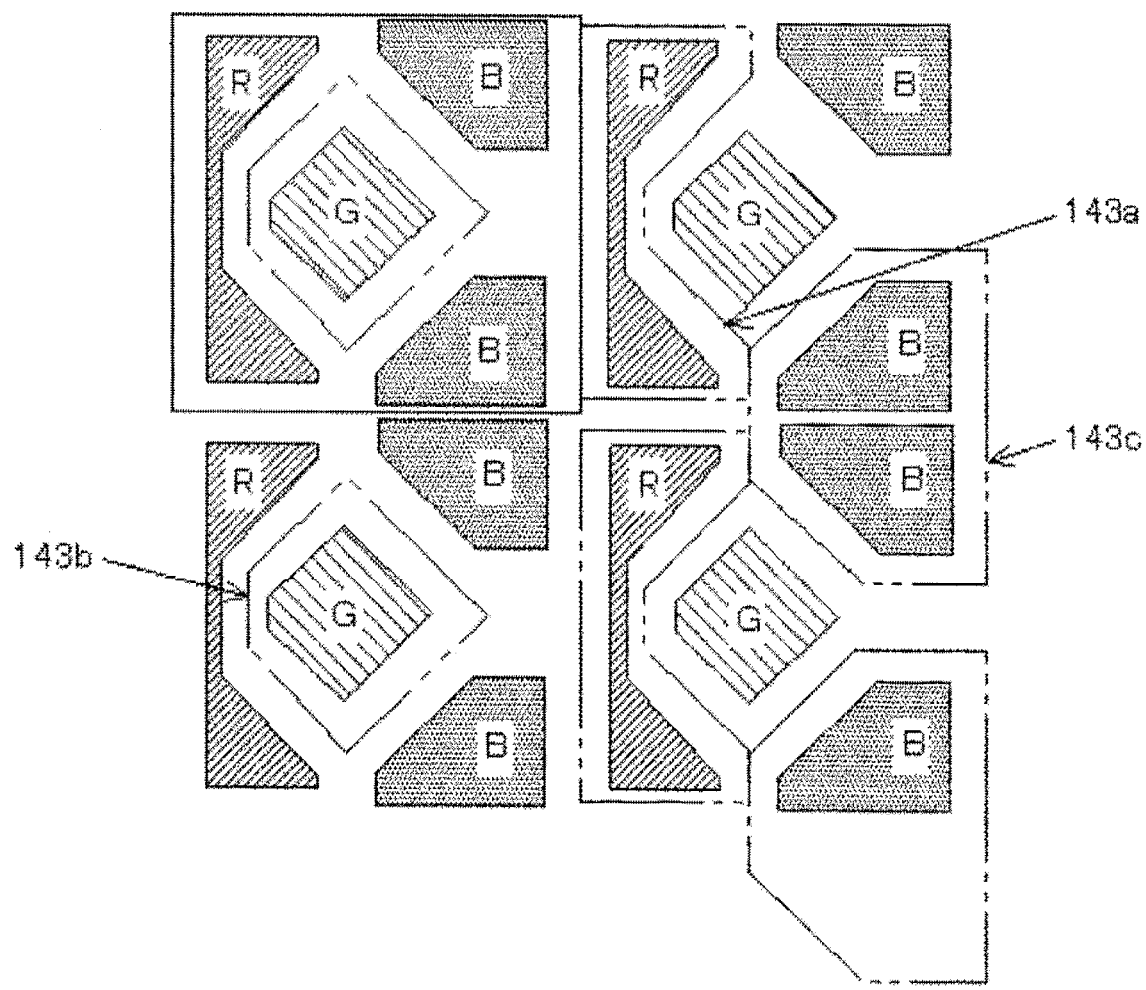
FIG. 14 is a plan view illustrating another example of a pixel arrangement structure according to an embodiment of the present invention.

FIG. 14 is another example of the pixel arrangement structure according to the present embodiment. Also in this pixel arrangement structure, a subpixel of R is located near two adjacent corners among the four corners of a pixel, subpixels of B which has the lowest luminosity factor are located near other two adjacent corners among the four corners of the pixel, and a subpixel of G which has the highest luminosity factor is located in the middle of the pixel. The subpixel of R is, however, not separated but is formed as one subpixel. That is, as to the subpixel of R, both the organic EL layer and anode electrode are continuously formed in a pixel. In this arrangement, each pixel is constituted by four subpixels including one subpixel of R, two subpixels of B and one subpixel of G.

Also in this pixel arrangement structure, the areas of subpixels are set to satisfy the expression: subpixel of G<one subpixel of R<two subpixels of B in view of the luminosity factors for the respective colors of RGB. Moreover, the aperture for a subpixel of B is unified with the aperture of a subpixel of B in the adjacent pixel to increase the size of the aperture. As for the subpixel of R, the aperture needs to cover the entire subpixel of R in the pixel. If the apertures of the subpixels of R in the adjacent pixels are unified as in the case of the subpixel of B, the aperture will be continuous across the entire display region of the organic EL display device and deformation of FMM is possibly caused, therefore the aperture is formed not to cross pixels in FIG. 14. Also in this pixel arrangement structure, each of one subpixel of R, two subpixels of B and a subpixel of G may preferably have a shape symmetrical with respect to the horizontal line passing the center of a rectangular pixel in order to suppress a bias in the luminosity factors, and the shape of the subpixel for each color may appropriately be modified as in the case of FIG. 11 to FIG. 13.

Figure 15:
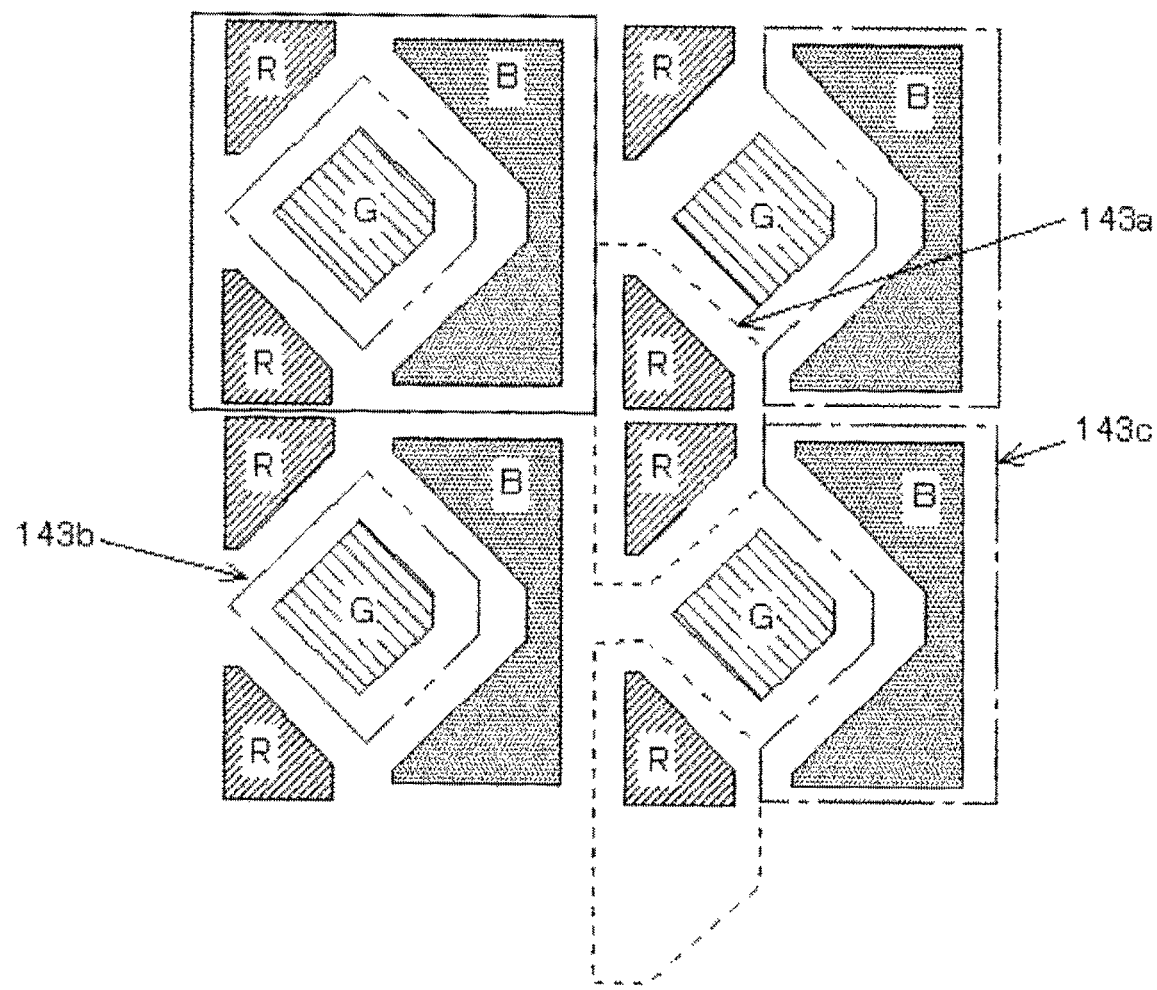
FIG. 15 is a plan view illustrating another example of a pixel arrangement structure according to an embodiment of the present invention.

FIG. 15 is another example of a pixel arrangement structure according to the present embodiment. In the pixel arrangement structure, subpixels of R are located near two adjacent corners among the four corners of a pixel, a subpixel of B which has the lowest luminosity factor is located near other two adjacent corners among the four corners of the pixel, and a subpixel of G which has the highest luminosity factor is located in the middle of the pixel. The subpixel of B is, however, not separated but formed as one subpixel. That is, as for the subpixel of B, both the organic EL layer and anode electrode are formed to be continuous in a pixel. Also in this arrangement, each pixel is constituted by four subpixels including two subpixels of R, one subpixel of B and one subpixel of G.

Also in this pixel arrangement structure, the areas of subpixels are set to satisfy the expression: subpixel of G<two subpixels of R<one subpixel of B, in view of the luminosity factors for the respective colors of RGB. Moreover, the subpixels of B may be linked to maintain the same area despite the less amount of protrusion toward the middle of the pixel, allowing the subpixel G to be located closer to the middle of the pixel, thereby suppressing a bias in the luminosity factors of the entire pixel. Furthermore, the aperture of a subpixel of R is unified with the aperture of a subpixel of R in the adjacent pixel to increase the size of the aperture, while the aperture of the subpixel of B has a shape not crossing pixels. Also in this pixel arrangement structure, each of two subpixels of R, one subpixel of B and a subpixel of G preferably has a shape symmetrical with respect to the horizontal line passing the center of a rectangular pixel in order to suppress bias in the luminosity factors, and the shape of the subpixel for each color may appropriately be modified as in the cases of FIG. 11 to FIG. 13.

Figure 16:
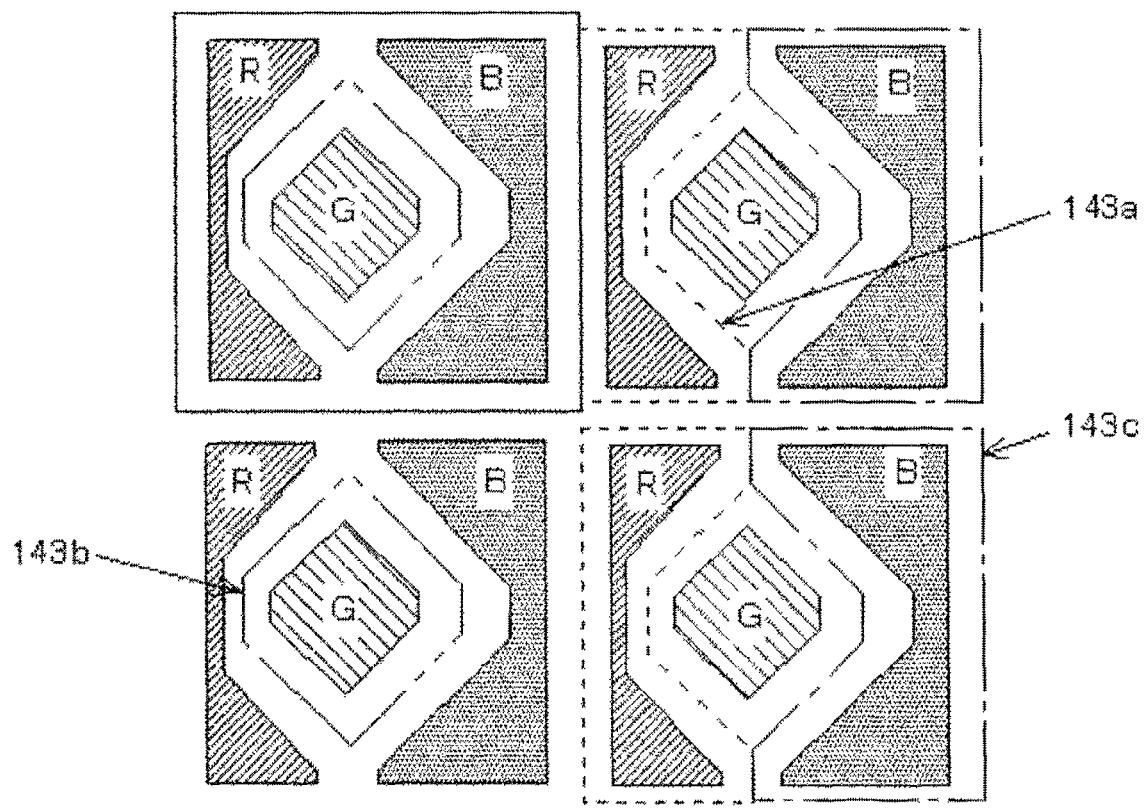
FIG. 16 is a plan view illustrating another example of a pixel arrangement structure according to an embodiment of the present invention.

FIG. 16 is another example of the pixel arrangement structure according to the present embodiment. Also in this pixel arrangement structure, a subpixel of R is located near two adjacent corners among the four corners of a pixel, a subpixel of B which has the lowest luminosity factor is located near other two adjacent corners among the four pixels, and a subpixel of G which has the highest luminosity factor is located in the middle of the pixel. The subpixels of each of R and B are, however, not separated but formed as one subpixel. That is, as to the subpixels of R and B, both the organic EL layer and anode electrode are formed continuously in the pixel. In this configuration, each pixel is constituted by three subpixels including one subpixel of R, one subpixel of B and one subpixel of G.

Also in this pixel arrangement structure, the areas of subpixels are set to satisfy the expression: subpixel of G<one subpixel of R<one subpixel of B, in view of the luminosity factors for the respective colors of RGB. Moreover, each of the apertures for subpixels of R and B has a shape not crossing pixels. Also in the pixel arrangement structure, each of the subpixels of RGB may preferably have a shape symmetrical with respect to the horizontal line passing the center of a rectangular pixel in order to suppress a bias in the luminosity factors, and the shape of the subpixel for each color may appropriately be modified as in the cases of FIG. 11 to FIG. 13.

It is to be noted that the shape of each subpixel, the distance between subpixels, and the distance between each subpixel and the peripheral part of a pixel are not limited to the illustrated configuration, but may appropriately be modified in consideration of the accuracy in manufacturing as well as the display performance required for an organic EL display device.

As described above, the subpixel of G is located around the middle, which allows G to always be located in substantially the middle in the pattern of vertical lines or horizontal lines, and therefore the occurrence of a color edge can be suppressed while a preferable mixture of colors can be obtained. As a preferable mixture of colors may be obtained even from a line of any angle with only one dot, the color recognition of a fine pattern may be improved. Furthermore, as to the subpixels of R and/or B, adjacent pixels and apertures may be unified so as to maintain a high aperture ratio and thereby to facilitate the fabrication of FMM. With this pixel arrangement structure, even if the subpixel of B is enlarged in order to ensure the reliability of OLED, no significant change is seen in the positional relationship between the subpixel B and the subpixel of G, preventing the color mixture performance from particularly being degraded.

First Example

Next, a pixel array and an electro optical device according to the first example of the present invention will be described with reference to FIG. 17 to FIG. 33.

While the pixel arrangement structure in the electro optical device (organic EL display device) according to the present invention has specifically been described in the embodiment as described above, the present example describes a method of manufacturing an organic EL display device including a pixel array having the pixel arrangement structure as described above. FIGS. 17, 19, 21 and 23 are plan views of one pixel with the pixel arrangement structure shown in FIG. 10, whereas FIGS. 18, 20, 22 and 24 are section views of a TFT part, a retention capacitance part and a light emitting element illustrated specifically for one subpixel.

Figure 17:
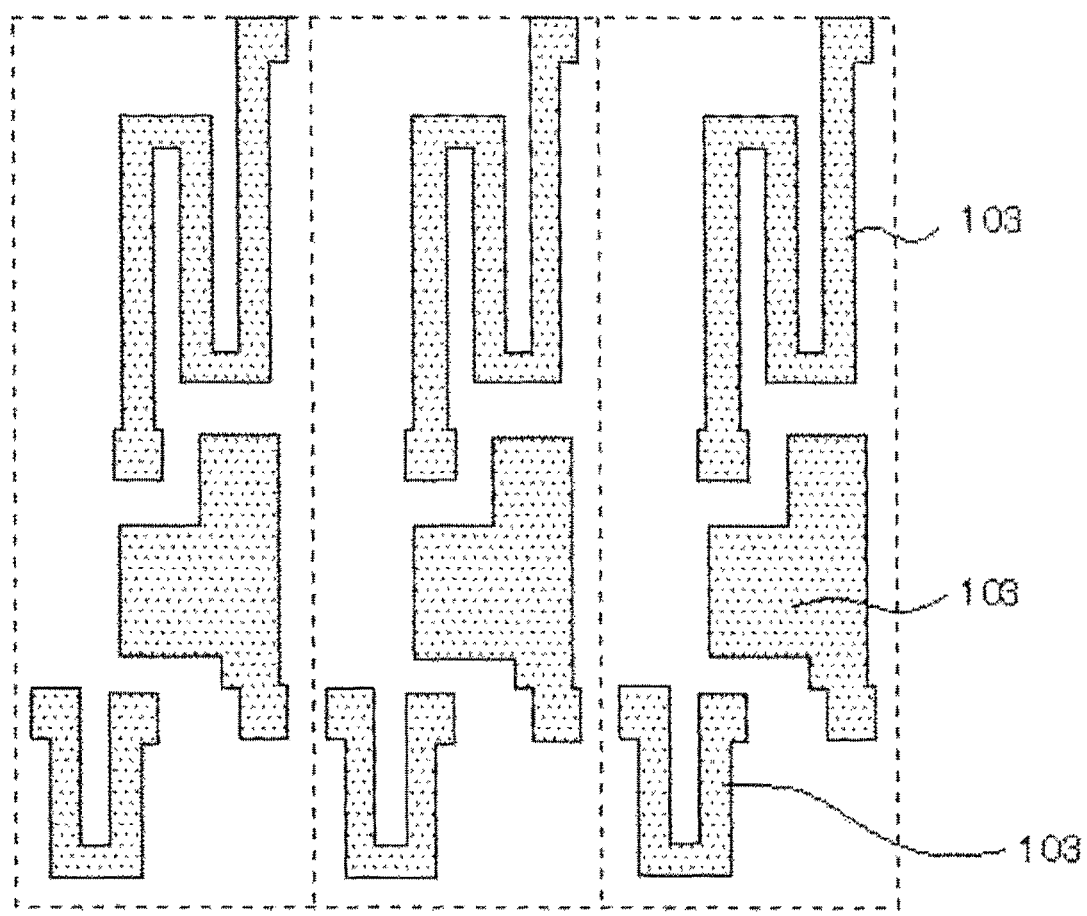
FIG. 17 is a plan view illustrating a manufacturing procedure (first step) of an organic EL display device according to the first example of the present invention.
Figure 18:
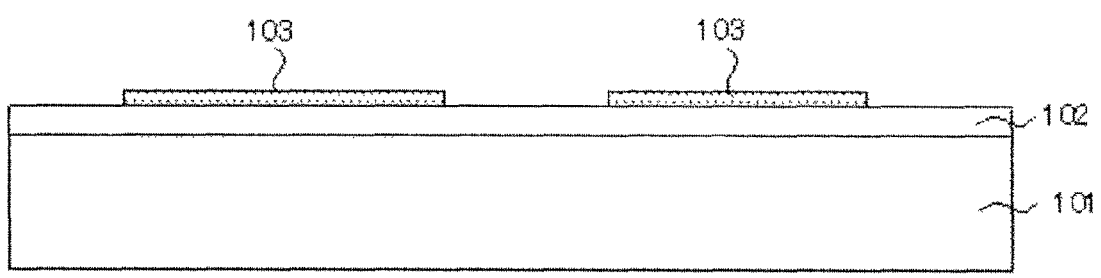
FIG. 18 is a section view illustrating a manufacturing procedure (first step) of an organic EL display device according to the first example of the present invention.

First, as illustrated in FIGS. 17 and 18, an underlying insulation film 102 is formed by depositing, for example, a silicon nitride film using, for example, chemical vapor deposition (CVD) method on a translucent substrate made of glass or the like (glass substrate 101). Next, a TFT part and a retention capacitance part are formed using a known low-temperature poly silicon TFT fabrication technique. More specifically, the CVD method or the like is used to deposit amorphous silicon, which is crystallized by excimer laser annealing (ELA) to form a poly silicon layer 103. Here, in order to secure a sufficient channel length of an M2 drive TFT which is used as a voltage-to-current conversion amplifier to suppress variation in output current, and to enable the connection between the drain of an M1 switch TFT and the data line 107a, the connection between the source of the M1 switch TFT and the C1 retention capacitance, the connection between the C1 retention capacitance and the power supply line 107b, the connection between the source of the M2 drive TFT and the power supply line 107b, and the connection between the drain of the M2 drive TFT and the anode electrode 111 of each subpixel, the poly silicon layer 103 is routed as illustrated.

Figure 19:
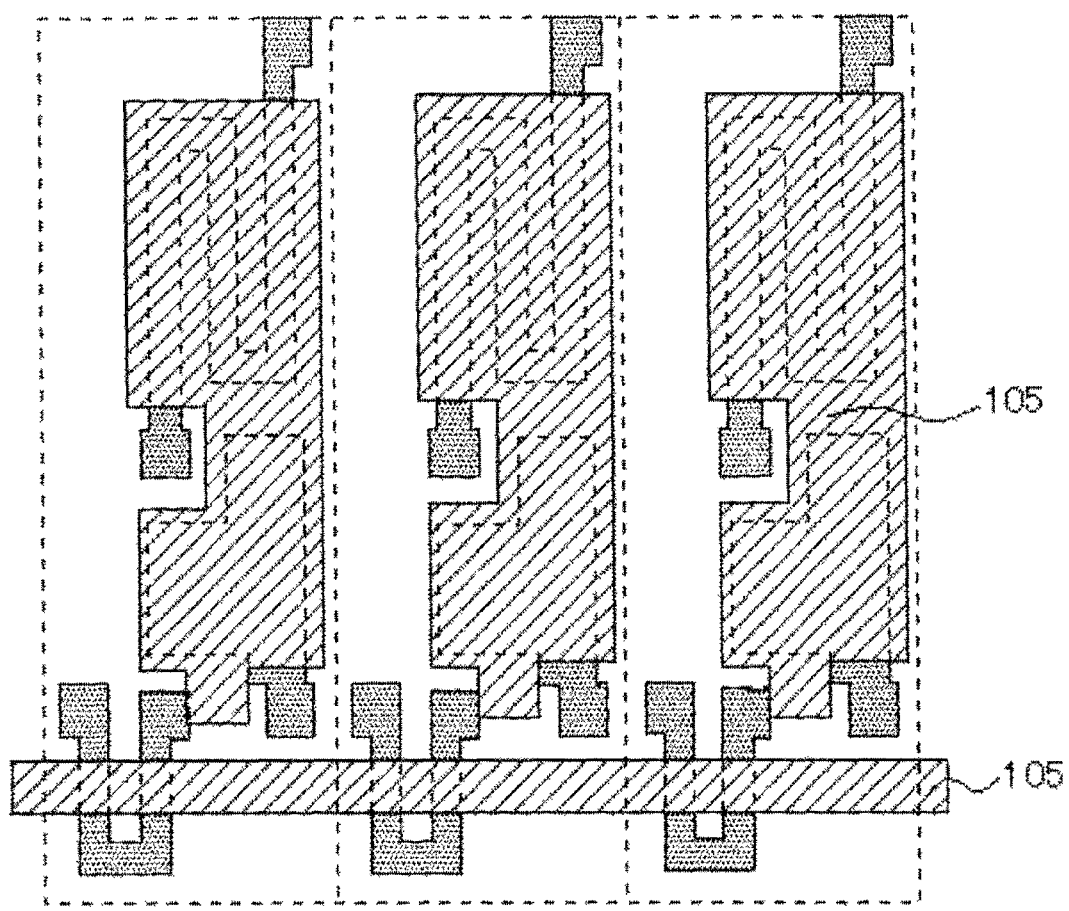
FIG. 19 is a plan view illustrating a manufacturing procedure (second step) of an organic EL display device according to the first example of the present invention.
Figure 20:
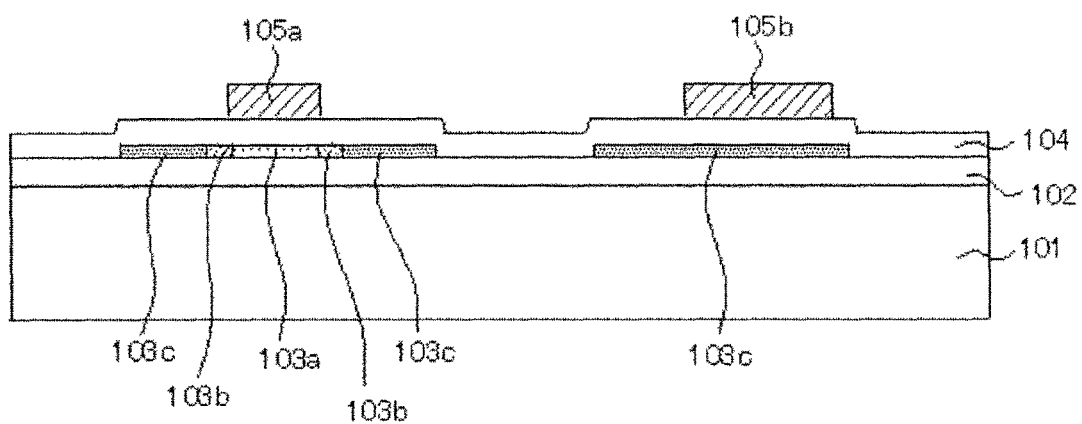
FIG. 20 is a section view illustrating a manufacturing procedure (second step) of an organic EL display device according to the first example of the present invention.

Next, as illustrated in FIGS. 19 and 20, a gate insulation film 104 is formed by depositing, for example, a silicon oxide film using the CVD method or the like on the poly silicon layer 103, and a gate electrode 105a and a retention capacitance electrode 105b are formed by further depositing, for example, molybdenum (Mo), niobium (Nb), tungsten (W) or an alloy thereof as the first metal layer 105 by the spattering technique. It is also possible to form the first metal layer 105 with a single layer of one substance selected from a group including, for example, Mo, W, Nb, MoW, MoNb, Al, Nd, Ti, Cu, Cu alloy, Al alloy, Ag and Ag alloy, or with a layered structure selected from a group including a two or more multi-layered structure of Mo, Cu, Al or Ag which is a low-resistance substance so as to reduce the interconnection resistance. Here, in order to increase the retention capacitance in each subpixel while facilitating the connection between the drain of the M1 switch TFT and the retention capacitance electrode 105b in each subpixel, the first metal layer 105 is formed to have the shape as illustrated. Next, additional impurity doping is applied to the poly silicon layer 103, which had been doped with a heavily-concentrated impurity layer (p+ layer 103c) prior to formation of the gate electrode, using the gate electrode 105a as a mask to form a lightly-concentrated impurity layer (p− layer 103b) with an intrinsic layer (i layer 103a) being sandwiched, so as to form a lightly doped drain (LDD) structure in the TFT part.

Figure 21:
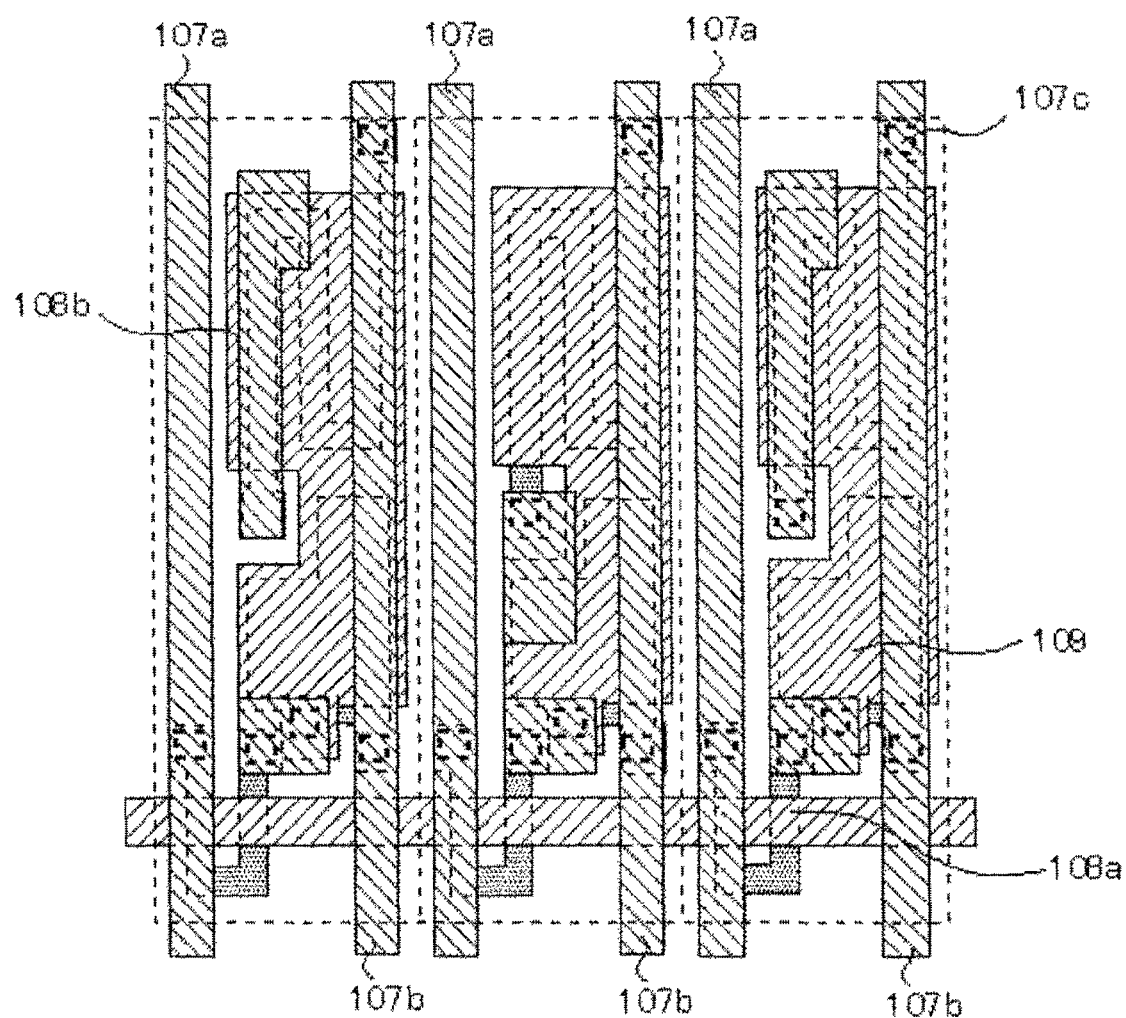
FIG. 21 is a plan view illustrating a manufacturing procedure (third step) of an organic EL display device according to the first example of the present invention.
Figure 22:
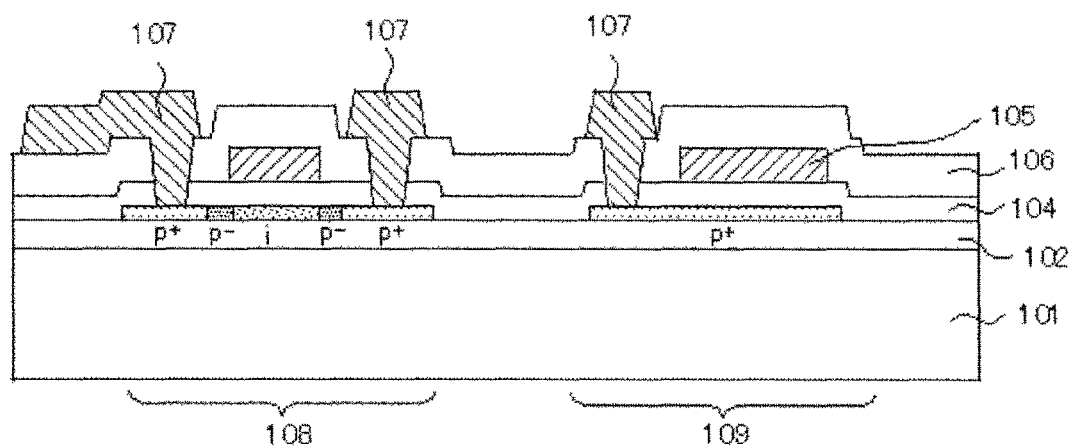
FIG. 22 is a section view illustrating a manufacturing procedure (third step) of an organic EL display device according to the first example of the present invention.

Next, as illustrated in FIGS. 21 and 22, the CVD method or the like is used to deposit, for example, a silicon oxide film to form an interlayer insulation film 106. Anisotropic etching is performed on the interlayer insulation film 106 and the gate insulation film 104, to open a contact hole (indicated by thick broken lines in the figure) for connection to the poly silicon layer 103. Next, using the spattering technique, the second metal layer 107 made of, for example, aluminum alloy such as Ti/Al/Ti is deposited, and patterning is performed to form the source/drain electrode, the data line 107a, the power supply line 107b, and the first contact part 107c. This allows connection between the data line 107a and the drain of the M1 switch TFT, between the source of the M1 switch TFT and the retention capacitance electrode 105b as well as the gate of the M2 drive TFT, and between the source of the M2 drive TFT and the power supply line 107b.

Figure 23:
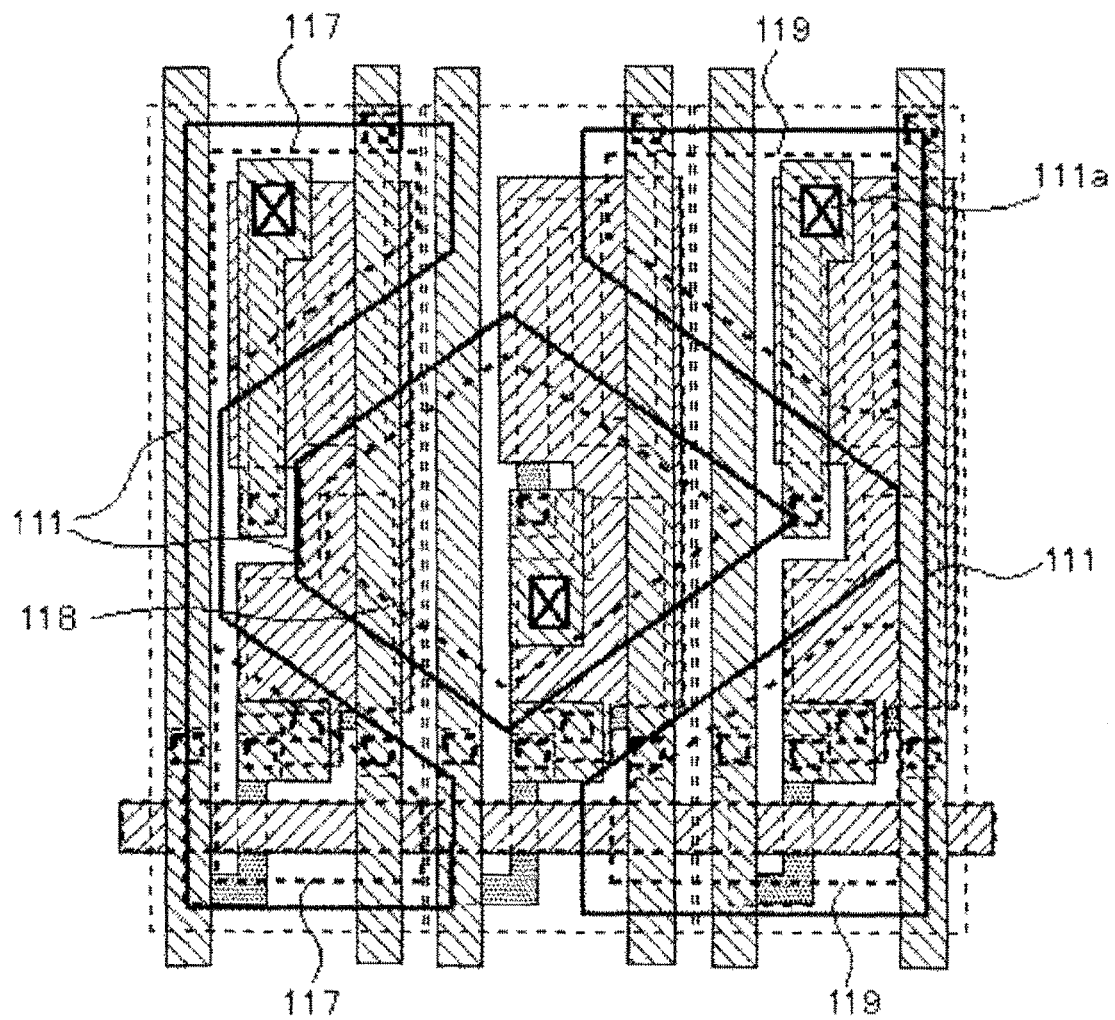
FIG. 23 is a plan view illustrating a manufacturing procedure (fourth step) of an organic EL display device according to the first example of the present invention.
Figure 24:
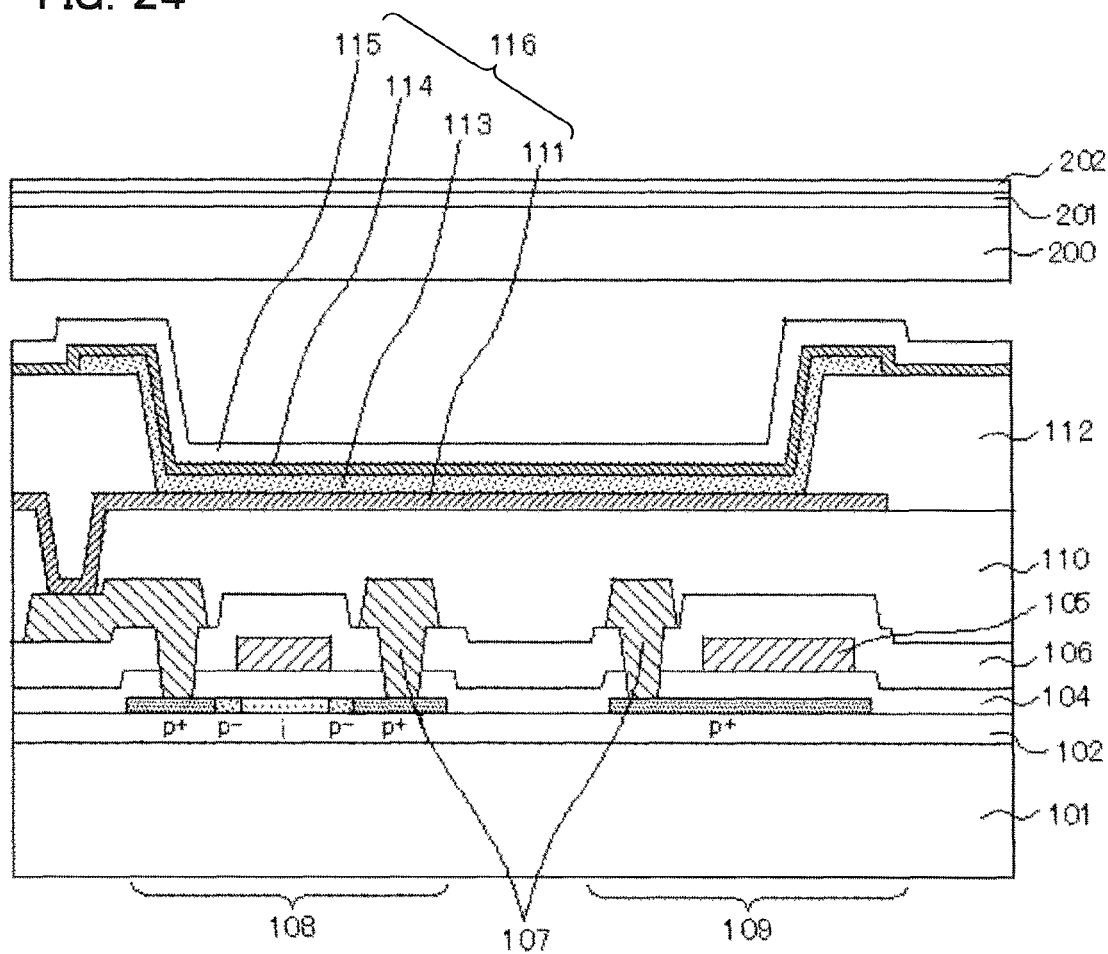
FIG. 24 is a section view illustrating a manufacturing procedure (fourth step) of an organic EL display device according to the first example of the present invention.

Next, as illustrated in FIGS. 23 and 24, a photosensitive organic material is applied to form a planarization film 110. The exposing condition is optimized to adjust a taper angle, to open a contact hole (part enclosed by a thick solid line marked with x) for connection to the drain of the M2 drive TFT. A reflection film is deposited thereon with metal of Ag, Mg, Al, Pt, Pd, Au, Ni, Nd, Ir, Cr or a compound thereof, and subsequently a transparent film of ITO, IZO, ZnO, $In_2O_3$ or the like is deposited thereon, while patterning is performed at the same time to form an anode electrode 111 for each subpixel. The anode electrode 111 is connected to the drain of the M2 drive TFT at the second contact part 111a. Though the anode electrode 111 requires a reflection film since it also serves as a reflection film in the top emission structure, the reflection film may be eliminated in the case of a bottom emission structure and the anode electrode 111 may be formed only with a transparent film such as ITO. Next, the spin coating technique is used to apply, for example, a photosensitive organic resin film to form an element isolation film 112 and then patterning is performed to form an element isolation layer in which the anode electrode 111 of each subpixel is exposed to the bottom. This element isolation layer serves to isolate the light emitting region of each subpixel.

Figure 25:
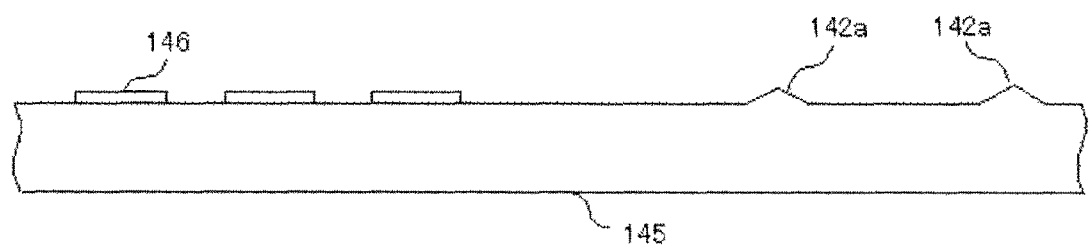
FIG. 25 is a section view schematically illustrating a method of fabricating a metal mask according to the first example of the present invention.
Figure 26:
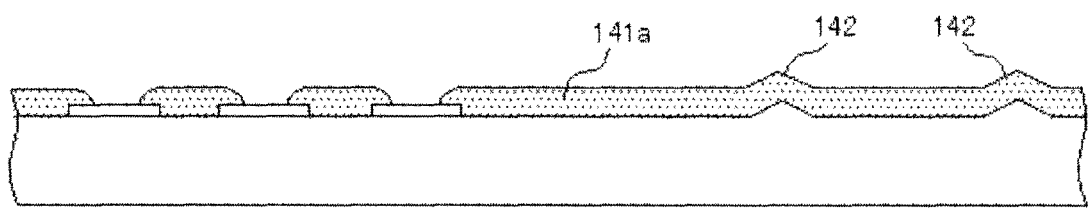
FIG. 26 is a section view schematically illustrating a method of fabricating a metal mask according to the first example of the present invention.
Figure 27:
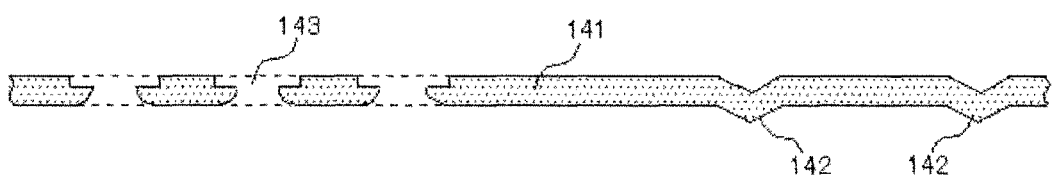
FIG. 27 is a section view schematically illustrating a method of fabricating a metal mask according to the first example of the present invention.
Figure 28:
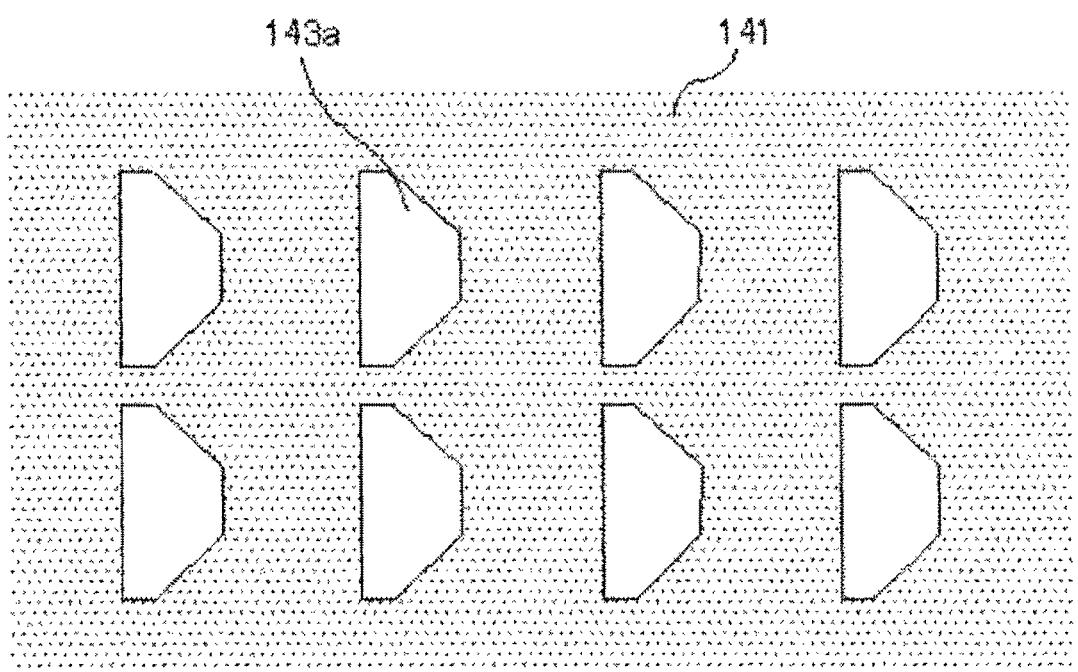
FIG. 28 is a plan view schematically illustrating a configuration of a metal mask (configuration of an R aperture) according to the first example of the present invention.
Figure 29:
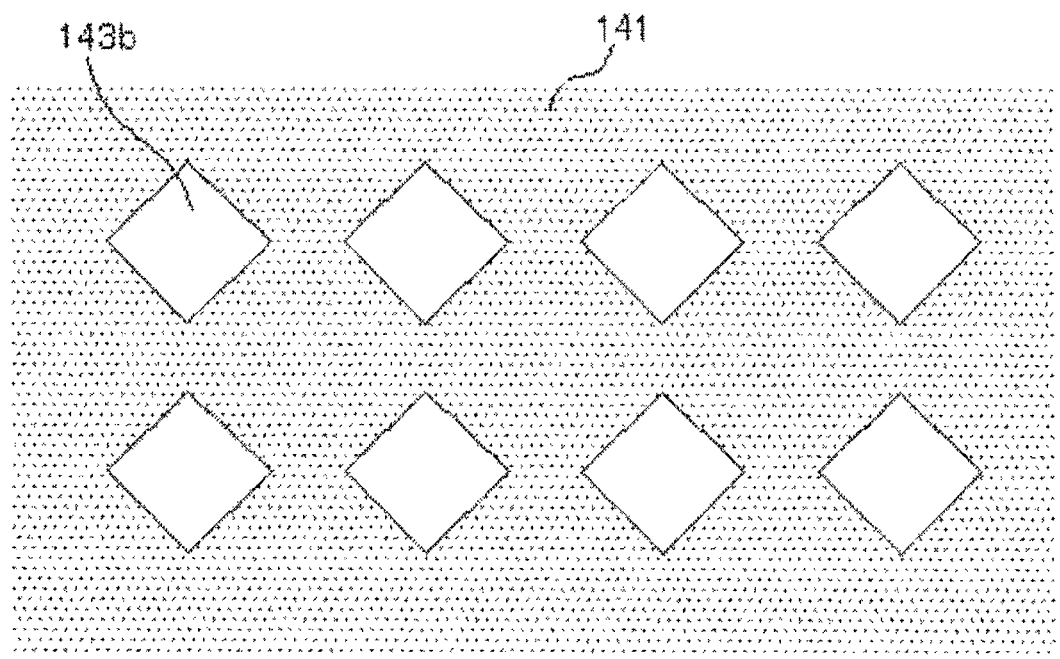
FIG. 29 is a plan view schematically illustrating a configuration of a metal mask (configuration of a G aperture) according to the first example of the present invention.
Figure 30:
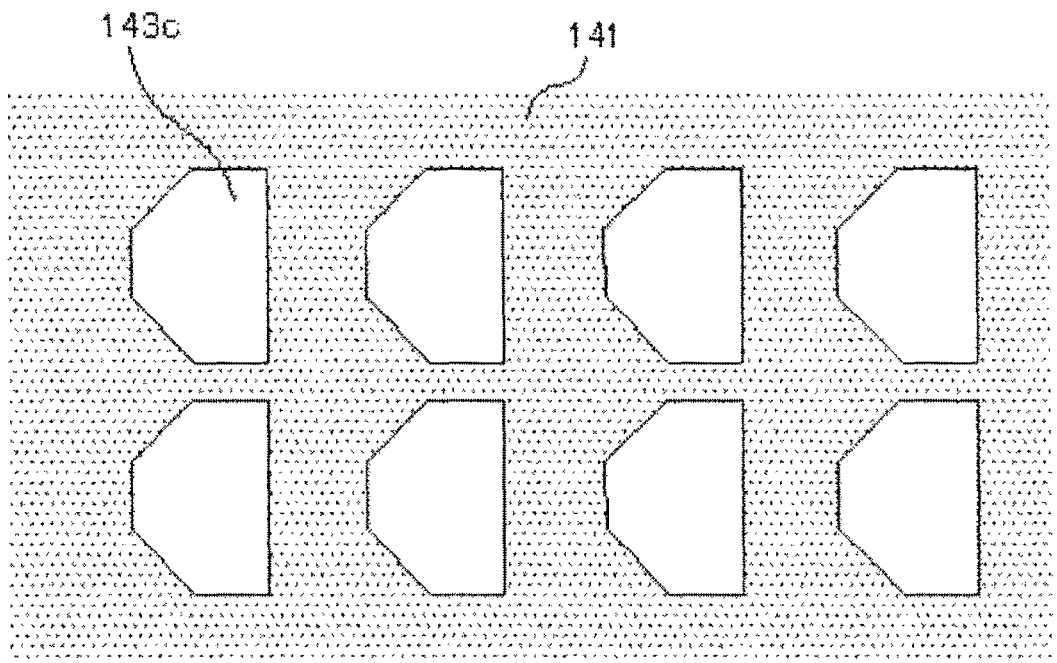
FIG. 30 is a plan view schematically illustrating a configuration of a metal mask (configuration of a B aperture) according to the first example of the present invention.
Figure 31:
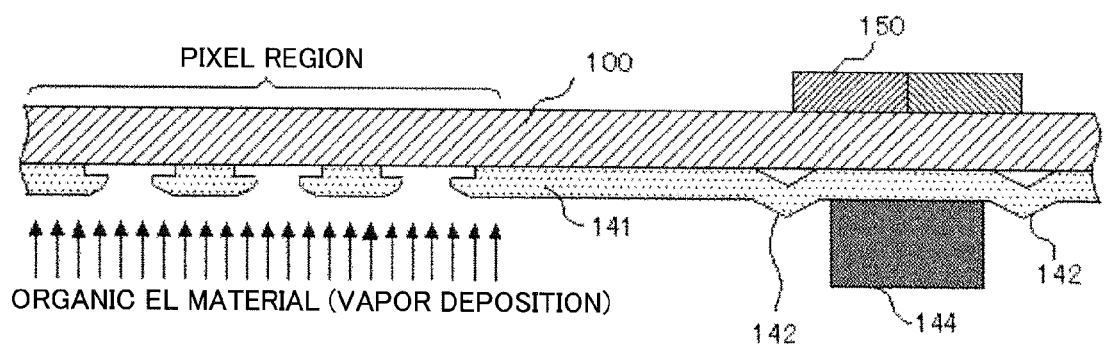
FIG. 31 is a section view schematically illustrating a method of forming a film of organic EL material using a metal mask according to the first example of the present invention.
Figure 32:
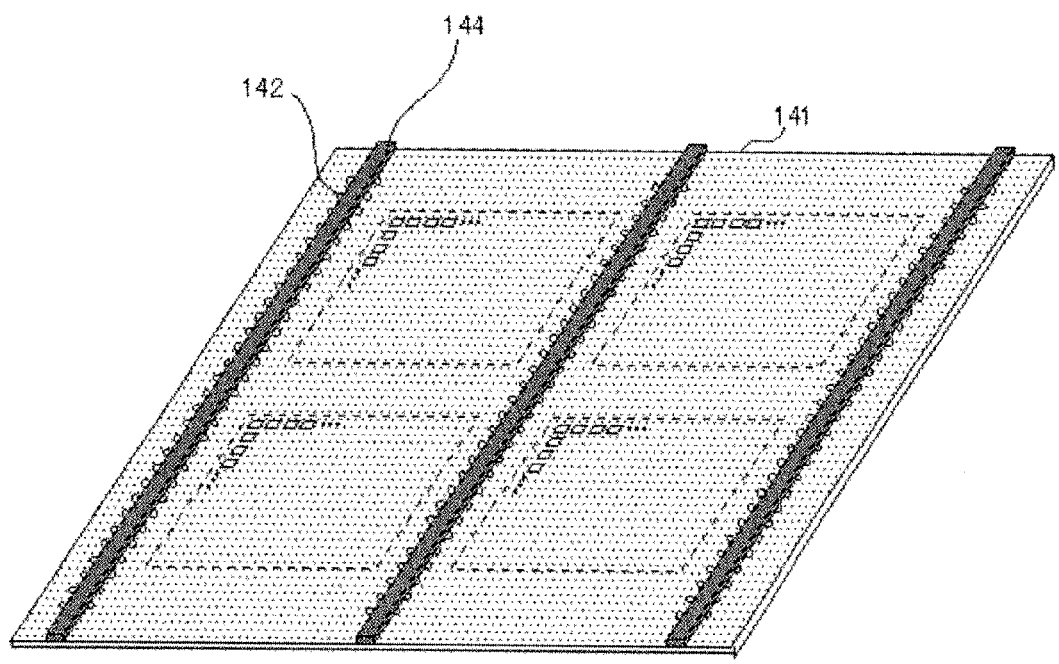
FIG. 32 is a perspective view illustrating a positional relationship between a metal mask main body and a reinforcement member according to the first example of the present invention.
Figure 33:
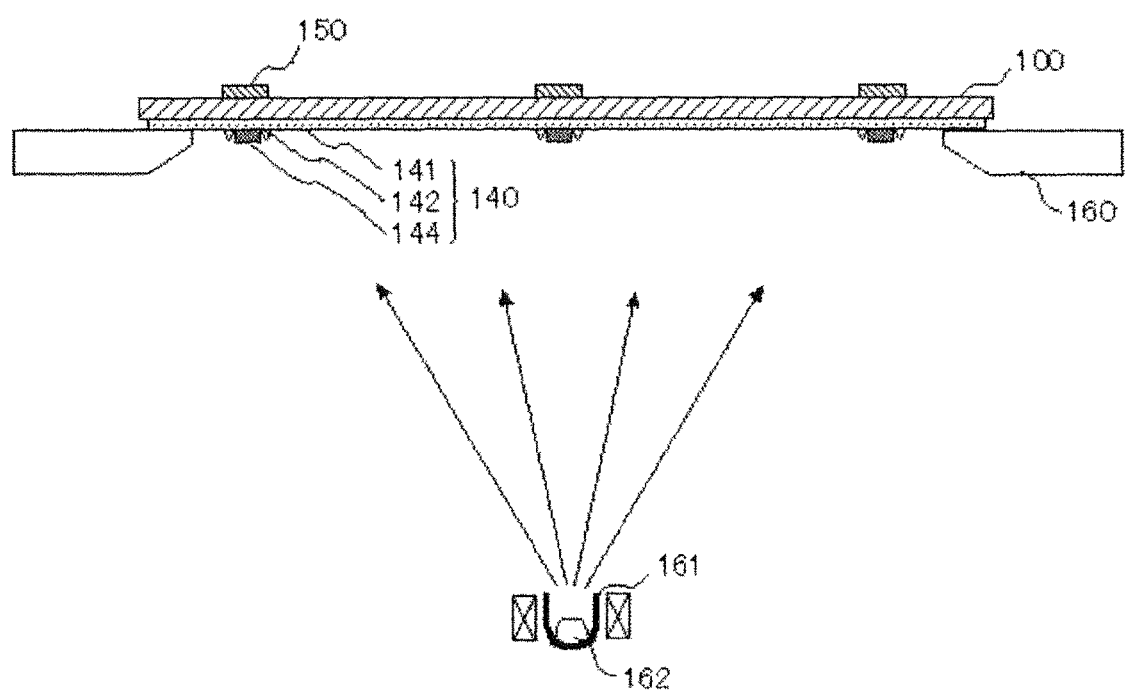
FIG. 33 is a section view schematically illustrating a method of forming a film of organic EL material using a metal mask according to the first example of the present invention.

Next, a film of organic EL material is formed on the glass substrate 101 on which the element isolation film 112 is formed. FIGS. 25 to 27 illustrate a method of fabricating a metal mask used in forming the film of organic EL material, showing the region near an end of an organic EL panel. Furthermore, FIGS. 28 to 30 are plan views each illustrating a part of a metal mask for forming a film of organic EL material for a different color, FIGS. 31 and 33 are section views schematically illustrating a method of forming a film of organic EL material using the metal mask, and FIG. 32 is a perspective view illustrating the positional relationship between a metal mask main body and a reinforcement member.

First, the method of fabricating a metal mask is described. While this metal mask may also be fabricated by forming an aperture at a portion corresponding to a subpixel of a metal mask member having a thin plate shape by punching or etching, a plating technique is used in the description here. More specifically, as illustrated in FIG. 25, a base material (electrocasting base material 145) for plating growth of the metal mask body is prepared. The material for the electrocasting base material 145 is not specifically limited but may be a material (glass material or alumite, for example) which has conductivity at least large enough for the current for electrolytic plating to flow (not required in the case of electroless plating) and which may form concavity and convexity by a technique such as cutting or etching.

Then, a protrusion 142a is formed at a portion where a guide part 142 is formed (i.e. a portion outside the pixel region of the organic EL panel), an underlying layer is formed by application of a conductive adhesive or black lead for a metal mask member 141a to easily be exfoliated or by plating growth of a coating film, as needed, photoresist is applied to the entire surface of the electrocasting base material 145, and light exposure and developing are performed so as to have a photoresist 146 remaining in a portion corresponding to a subpixel in each pixel. Here, in the plating, since the metal mask member 141a grown from the electrocasting base material 145 grows to cover the photoresist 146, the size of the photoresist pattern is determined in consideration of the amount of the metal mask member 141a covering the photoresist 146 while setting the thickness of the photoresist 146 and the condition of plating growth.

Next, the electrocasting base material 145 on which the photoresist 146 is formed is soaked in an electrolytic solution, and predetermined current is applied in the case of electrolytic plating, to let the metal mask member 141a having a predetermined thickness grow on the electrocasting base material 145. The metal mask member 141a may be, for example, nickel, nickel alloy, nickel-cobalt alloy, nickel-iron alloy such as invar. It is also possible, in the plating growth of the metal mask member 141a, to use a method of forming the first metal to the thickness corresponding to that of a photoresist and then forming the second metal thereon as disclosed in Japanese Patent Application Laid-Open Publication No. 2005-206881.

After the plating growth, the electrocasting base material 145 obtained by the growth of the metal mask member 141a is soaked in a predetermined stripping solution (e.g., acetone or methyl chloride) to separate the metal mask member 141a together with the photoresist 146 from the electrocasting base material 145, to completely form the metal mask main body 141 in which the aperture 143 and the guide part 142 corresponding to subpixels are formed, as illustrated in FIG. 27. FIG. 28 is an example of the metal mask main body 141 in which an R aperture 143a corresponding to the subpixel of R is formed, FIG. 29 is an example of the metal mask main body 141 in which a G aperture 143b corresponding to the subpixel of G is formed, and FIG. 30 is an example of the metal mask main body 141 in which a B aperture 143c corresponding to the subpixel of B is formed. In the present example, though the subpixels of each of R and B are divided into two, each subpixel shares an aperture with a subpixel of the same color in the adjacent pixel, making it possible to increase the size of the R aperture 143a and B aperture 143c, thereby facilitating the fabrication of a metal mask. The R aperture has a continuous shape (not crossing pixels) in a pixel in the case of the pixel arrangement structure in FIG. 14, the B aperture has a continuous shape in a pixel in the case of the pixel arrangement structure in FIG. 15, and the R aperture and B aperture have continuous shapes in a pixel in the case of the pixel arrangement structure in FIG. 16.

Thereafter, as illustrated in FIGS. 31 to 33, a reinforcement member 144 having a predetermined characteristic (strength, coefficient of thermal expansion and magnetic property) is arranged at a properly-aligned position on a portion defined by the guide part 142 of the metal mask main body 141, the metal mask main body 141 provided with the reinforcement member 144 is arranged at a properly-aligned position on the top surface (the film forming surface on which the bank layer described above is formed) of the TFT substrate 100, and a fixing member 150 such as a magnet is arranged at a position opposed to the reinforcement member 144 on the rear surface of the TFT substrate 100, so as to fix the metal mask 140 to the TFT substrate 100. The TFT substrate 100 is then set in a stage 160 in a vacuum chamber of a vapor deposition apparatus with the surface thereof facing downward, a crucible 161 is heated to evaporate the organic EL material as an evaporation material 162, and the organic EL material is vapor-deposited at a position corresponding to each subpixel of the TFT substrate 100 through the aperture 143 of the metal mask main body 141. The reinforcement member is arranged at an intermediate part of the adjacent organic EL panel forming region. Since no aperture pattern is arranged here, the reinforcement member would not affect any aperture pattern. Employment of such a structure can suppress deformation of a metal mask, reduce the time and cost required for attachment of the metal mask, and easily restore the misalignment or warpage of the metal mask.

While the guide part 142 is so formed that the surface on the opposite side of the TFT substrate 100 of the metal mask main body 141 protrudes in the description above, it is also possible to form a concave part for guiding so that the surface opposite to the TFT substrate 100 is recessed, which may be fitted with a convex part provided on the reinforcement member 144. Moreover, in the description above, though the cross section of the reinforcement member 144 or fixing member 150 is formed to have a rectangular shape, the cross section is not limited to the illustrated shape but may also be a trapezoidal shape or a semicircular shape. Furthermore, in order for the metal mask main body 141 not to be in contact with the entire surface of the TFT substrate 100, a convex part protruding toward the TFT substrate 100 side may be formed at a predetermined portion outside the organic EL panel forming region such that the metal mask main body 141 makes contact with the TFT substrate 100 only through the convex part. Furthermore, though a plating technique is used as an example of the method of fabricating the metal mask main body 141 in the description above, an etching technique may alternatively be used.

Referring back to FIGS. 23 and 24, a film of organic EL material may be formed for each color of RGB, and the organic EL layer 113 is formed on the anode electrode 111. Here, as to the subpixels of R and B, a film of organic EL material is formed across two adjacent pixels, while the anode electrode 111 is isolated for each pixel and the portion without the anode electrode 111 does not contribute to light emission, and therefore the organic EL layer 113 formed to cross pixels will be no problem. The organic EL layer 113 is constituted by, for example, a hole injection layer, a hole transportation layer, a light emission layer, an electron transportation layer, an electron injection layer and the like from the lower layer side. Moreover, the organic EL layer 113 may have any structure of the combinations including: electron transportation layer/light emission layer/hole transportation layer; electron transportation layer/light emission layer/hole transportation layer/hole injection layer; and electron injection layer/electron transportation layer/light emission layer/hole transportation layer, or may be a light emission layer alone, or may also be added with an electron blocking layer or the like. The material for the light emission layer is different for each color, while the film thickness of the hole injection layer, the hole transportation layer or the like is individually controlled for each subpixel as needed.

Metal having a small work function, i.e. Li, Ca, LiF/Ca, LiF/Al, Al, Mg or a compound thereof, is vapor-deposited on the organic EL layer 113 to form a cathode electrode 114. The film thickness of the cathode electrode 114 is optimized to increase the light extraction efficiency and to ensure preferable viewing angle dependence. In the case where the cathode electrode 114 has a high resistance thereby losing the uniformity in luminance, an auxiliary electrode layer is added thereon with a substance for forming a transparent electrode such as ITO, IZO, ZnO or $In_2O_3$. Furthermore, in order to improve the light extraction efficiency, an insulation film having a refractive index higher than that of glass is deposited to form a cap layer 115. The cap layer 115 also serves as a protection layer for the organic EL element.

As described above, the light emitting element 116 corresponding to each subpixel of RGB is formed, and a portion where the anode electrode 111 and the organic EL layer 113 are in contact with each other (the aperture part of the element separation film 112) will be the R light emitting region 117, the G light emitting region 118 or the B light emitting region 119.

In the case where the light emitting element 116 has a bottom emission structure, the cathode electrode 114 (transparent electrode such as ITO) is formed on the upper layer of the planarization film 110, whereas the anode electrode 111 (reflection electrode) is formed on the organic EL layer 113. Since the bottom emission structure does not require light extraction to the upper surface, a metal film of Al or the like may be formed thick, which can significantly reduce the resistance value of the cathode electrode and thus the bottom emission structure is suitable for a large device. It is, however, not suitable to a highly precise structure due to an extremely small light emitting region because the TFT element and the wiring part cannot transmit light.

Next, a glass frit coats around the outer circumference of the TFT substrate 100, a sealing glass substrate 200 is mounted thereon, and the glass frit part is heated and melted with laser or the like to tightly seal the TFT substrate 100 and the sealing glass substrate 200. Thereafter, a λ/4 retardation plate 201 and a polarization plate 202 are formed on the light emission side of the sealing glass substrate 200, to complete the organic EL display device.

While FIG. 17 to FIG. 33 illustrate an example of the method of manufacturing an organic EL display device according to the present example, the manufacturing method is not particularly limited thereto if the pixel arrangement structure described in the embodiment may be realized.

Second Example

Next, an electro optical device and an electric apparatus according to the second example of the present invention will be described with reference to FIG. 34 to FIG. 37. In the present example, various types of electric apparatus including an organic EL display device as a display means will be described as an application example of the organic EL display device.

Figure 34:
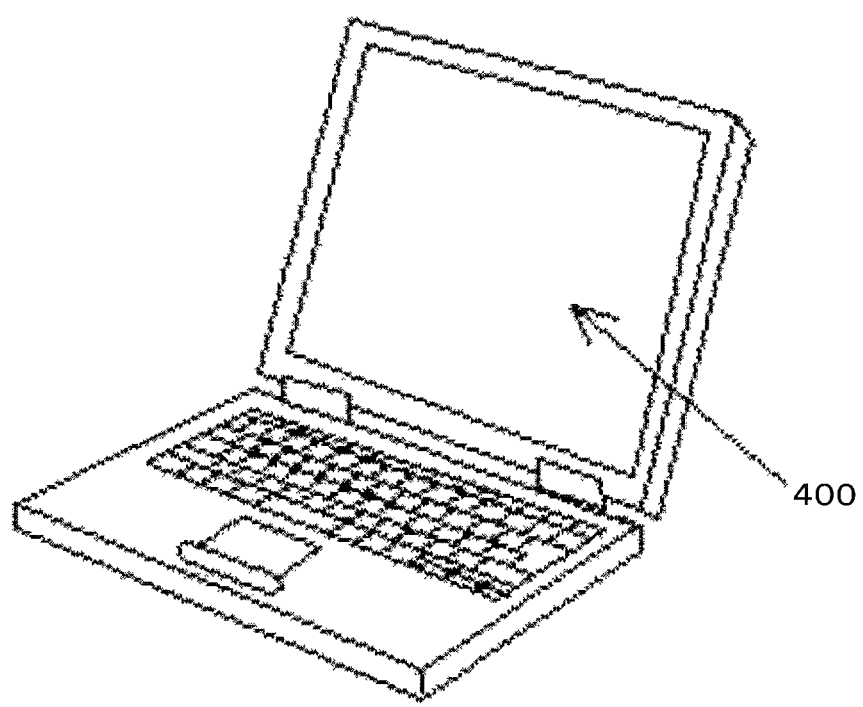
FIG. 34 is a schematic view illustrating an application example of an organic EL display device according to the second example of the present invention.
Figure 35:
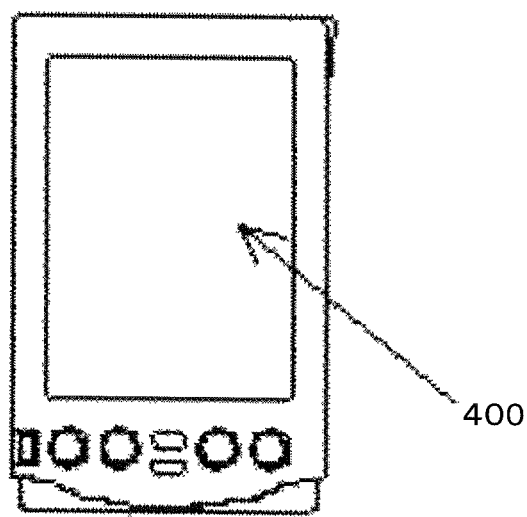
FIG. 35 is a schematic view illustrating an application example of an organic EL display device according to the second example of the present invention.
Figure 36:
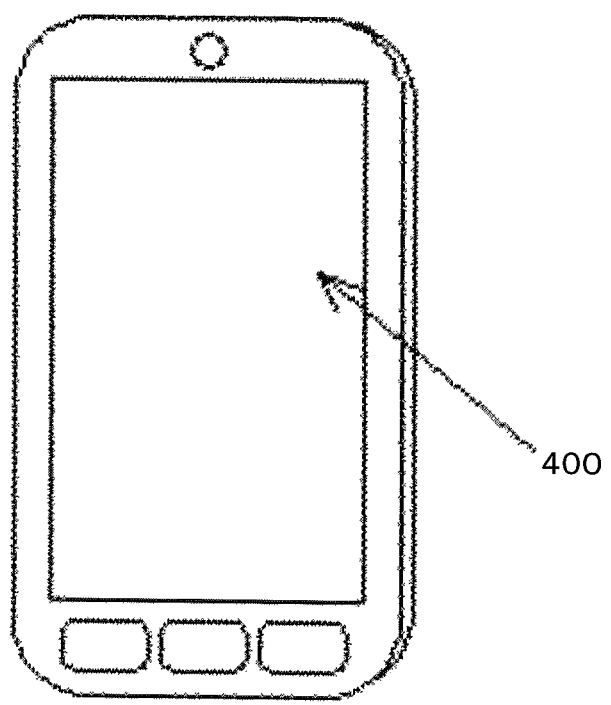
FIG. 36 is a schematic view illustrating an application example of an organic EL display device according to the second example of the present invention.
Figure 37:
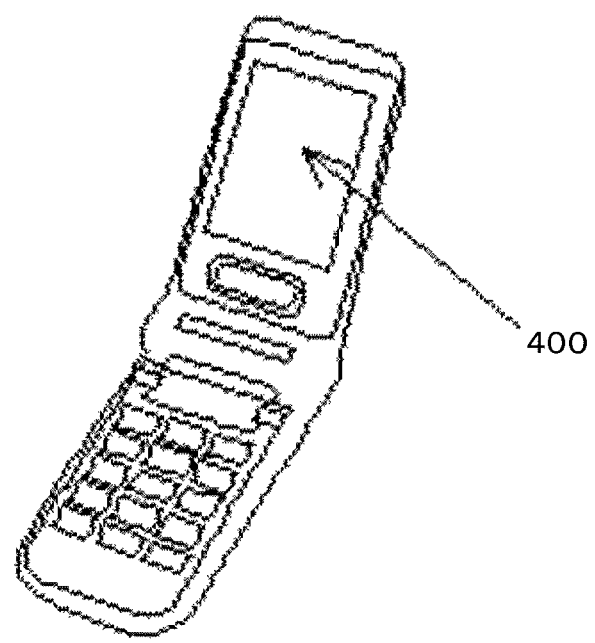
FIG. 37 is a schematic view illustrating an application example of an organic EL display device according to the second example of the present invention.

FIG. 34 to FIG. 37 illustrate examples of electric apparatus to which an electro optical device (organic EL display device) according to the present invention is applied. FIG. 34 is an example of application to a personal computer, FIG. 35 is an example of application to a portable terminal device such as a personal digital assistant (PDA), an electronic notebook, an electronic book, a tablet terminal, FIG. 36 is an example of application to a smartphone, and FIG. 37 is an example of application to a mobile phone. The organic EL display device 400 according to the present invention may be utilized for a display part of these types of electric apparatus. Application may be possible to any electric apparatus provided with a display device without specific limitation, for example, to a digital camera, a video camera, a headmounted display, a projector, a facsimile device, a portable TV, a demand side platform (DSP) device and the like.

Third Example

Next, an electro optical device and electric apparatus according to the third example of the present invention will be described with reference to FIG. 38 to FIG. 41. While a case where the organic EL display device as the electro optical device of the present invention is applied to electric apparatus provided with a planar display part is described in the second example above, the organic EL display device may also be applied to electric apparatus requiring a curved display part by making it deformable.

Figure 38:
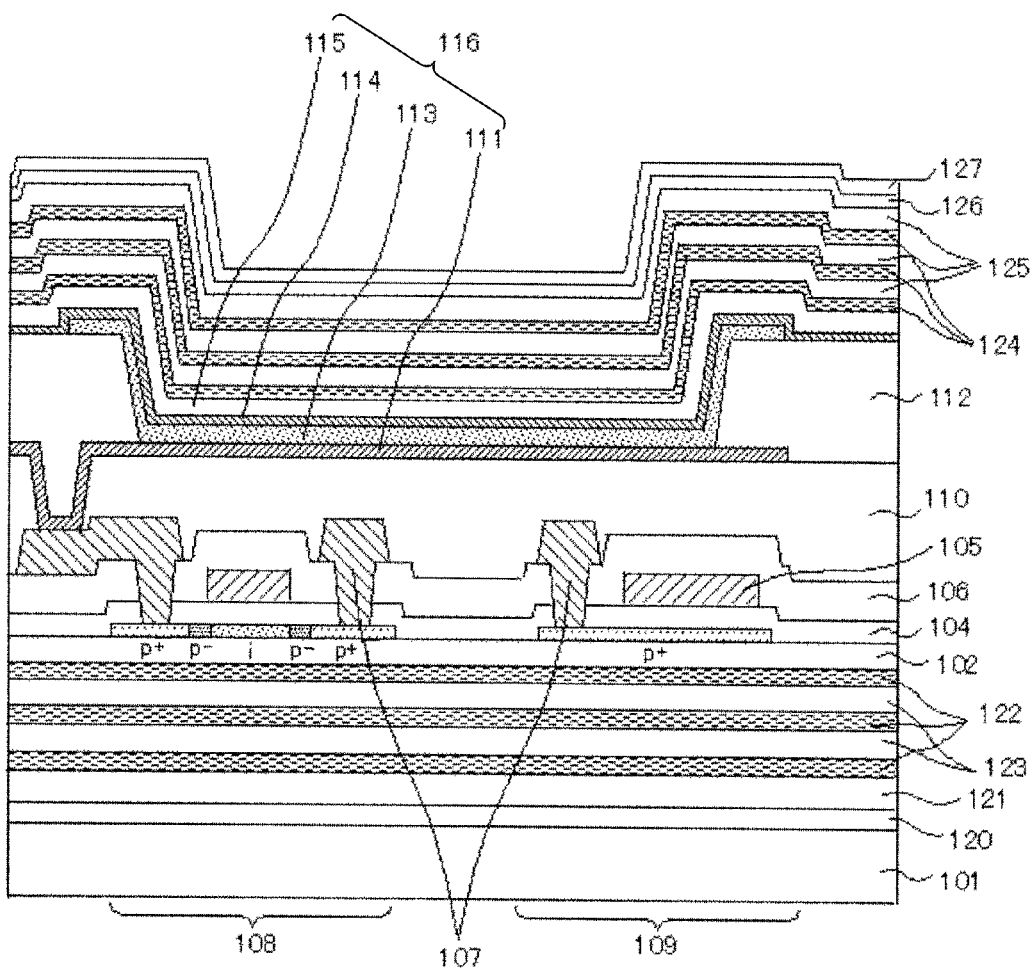
FIG. 38 is a section view schematically illustrating a structure of an organic EL display device according to the third example of the present invention.

FIG. 38 is a section view illustrating a structure of a deformable organic EL display device. This structure is different from the first example described above in that (1) TFT part 108 (M1 switch TFT 108*a*, M2 drive TFT 108*b*) and retention capacitance part 109 are formed on a flexible substrate, and (2) no sealing glass substrate 200 is arranged on the light emitting element 116.

First, as to (1), a stripping film 120 such as organic resin which can be removed with a stripping solution is formed on a glass substrate 101, and a flexible substrate 121 having flexibility made of, for example, polyimide is formed thereon. Next, an inorganic thin film 122 such as a silicon oxide film or silicon nitride film and an organic film 123 such as organic resin are alternately layered. Then, on the top layer film (inorganic thin film 122 here), an underlying insulation film 102, a poly silicon layer 103, a gate insulation film 104, a first metal layer 105, an interlayer insulation film 106, a second metal layer 107 and a planarization film 110 are sequentially formed, to form a TFT part 108 and a retention capacitance part 109, according to the manufacturing method described in the first example.

Moreover, as to (2), the anode electrode 111 and the element isolation film 112 are formed on the planarization film 110, and the organic EL layer 113, the cathode electrode 114 and the cap layer 115 are sequentially formed on the bank layer from which the element separation film 112 is removed, to form the light emitting element 116. Thereafter, an inorganic thin film 124 of a siliconoxide film, silicon nitride film or the like and an organic film 125 of organic resin or the like are alternately layered on the cap layer 115, and a λ/4 retardation plate 126 and a polarization plate 127 are formed on the top layer film (organic film 125 here).

Thereafter, the stripping film 120 on the glass substrate 101 is removed with a stripping solution or the like, to detach the glass substrate 101. In this structure, since the glass substrate 101 and the sealing glass substrate 200 are eliminated while the entire organic EL display device is deformable, application may be possible to electric apparatus having different purposes which requires a curved display part, particularly to wearable electric apparatus.

Figure 39:
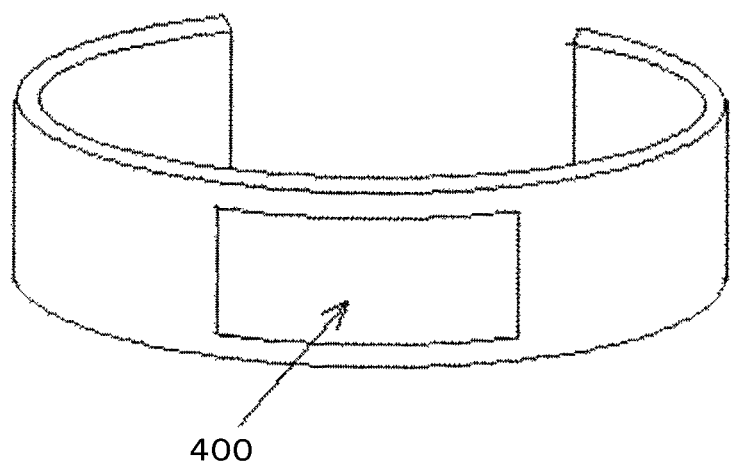
FIG. 39 is a schematic view illustrating an application example of an organic EL display device according to the third example of the present invention.

For example, the organic EL display device 400 according to the present invention may be utilized for a display part of wrist band electric apparatus to be attached on a wrist as illustrated in FIG. 39 (terminal linked with a smartphone, terminal provided with a global positioning system (GPS) function, terminal for measuring human body information such as pulse or body temperature, for example). In the case of the terminal linked with a smartphone, a communication means provided in the terminal in advance (short distance wireless communication unit which operates in accordance with a standard such as Bluetooth (registered trademark) or near field communication (NFC)) may be used to display received image data or video data on the organic EL display device 400. Furthermore, in the case of a terminal provided with a GPS function, it is possible to display the positional information, the moving distance information and the moving speed information specified based on GPS signals on the organic EL display device 400. Moreover, in the case of a terminal for measuring human body information, the measured information may be displayed on the organic EL display device 400.

Figure 40:
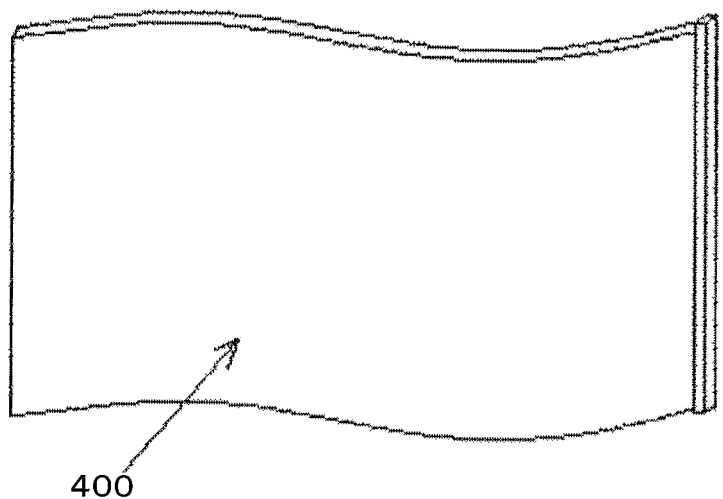
FIG. 40 is a schematic view illustrating another application example of an organic EL display device according to the third example of the present invention.

Furthermore, the organic EL display device 400 according to the present invention may also be utilized for an electronic paper as illustrated in FIG. 40. For example, the image data or video data, stored in a storage part located at an end of an electronic paper may be displayed on the organic EL display device 400, or the image data or video data received through an interface means (e.g., a wired communication unit such as universal serial bus (USB) or a wireless communication unit which operates in accordance with a standard such as Ethernet (registered trademark), fiber-distributed data interface (FDDI) or Token Ring located at an end of the electronic paper, may be displayed on the organic EL display device 400.

Figure 41:
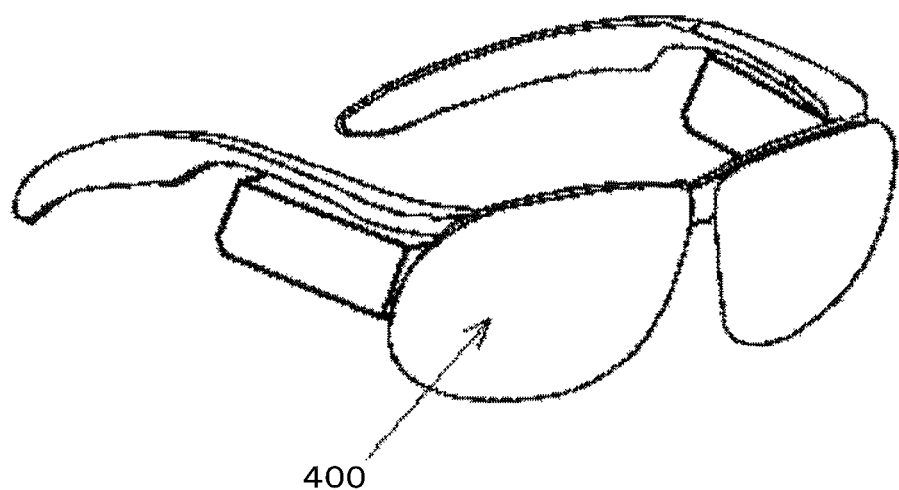
FIG. 41 is a schematic view illustrating another application example of an organic EL display device according to the third example of the present invention.

Moreover, the organic EL display device 400 according to the present invention may also be utilized for the display part of a glass-type electronic apparatus to be attached to a face, as illustrated in FIG. 41. For example, the image data or video data stored in a storage part located at a temple of eyeglasses, sunglasses, goggles or the like may be displayed on the organic EL display device 400, or the image data or video data received through an interface means located at the temple (e.g., wire communication unit such as USB, short-distance wireless communication unit which operates in accordance with a standard such as Bluetooth (registered trademark) or NFC, or mobile communication unit for communicating through a mobile communication network such as long term evolution (LTE)/3G), may be displayed on the organic EL device 400.

It is to be understood that the present invention is not limited to the examples described above, but may appropriately be modified for the type or structure of the electro optical device, material of each component, fabrication method and the like without departing from the spirit of the present invention.

For example, though the present embodiment and examples described that pixels each constituted by the subpixels of RGB are arranged in matrix, the arrangement of pixels is not limited to matrix. The present invention may also be applicable to an arrangement in which upper and lower or left and right pixels are shifted from one another by the size of a half pixel.

Moreover, though the present embodiment and examples described that the subpixels are three colors of RGB, the pixel arrangement structure of the present invention may also be applicable to any three colors having different luminosity factors.

Furthermore, the electro optical device according to the present invention is not limited to the organic EL display device as described in the embodiment and examples. Also, the substrate which constitutes pixels is not limited to the TFT substrate as described in the embodiment and examples. The substrate which constitutes pixels may also be applicable to a passive substrate, not limited to an active substrate. Further, though a circuit constituted by an M1 switch TFT, an M2 drive TFT and a C1 retention capacitance (so-called 2T1C circuit) has been illustrated as a circuit to control pixels, a circuit including three or more transistors (e.g., 3T1C circuit) may also be employed.

The present invention may be applicable to an electro optical device such as an organic EL display device including a pixel array in which pixels constituted by multiple subpixels are two-dimensionally arranged, and to an electric apparatus using such an electro optical device as a display device.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A pixel array in which rectangular pixels, each enclosing a subpixel of a first color which has a highest luminosity factor, a subpixel of a second color and a subpixel of a third color which has a lowest luminosity factor, are two-dimensionally arranged, wherein
the subpixel of the second color includes a first portion and a second portion located respectively near two corners adjacent to each other in a first direction of the rectangular pixels,
the subpixel of the third color includes a first portion and a second portion located near other two corners adjacent to each other in the first direction of the rectangular pixel,
the subpixel of the first color is located at a middle part including a center of gravity of the rectangular pixel,
the subpixel of the third color has a larger area than each of the subpixels of the first color and the second color, and
in a second direction orthogonal to the first direction, each of the subpixels of the second color and the third color has the widest near a pixel boundary in the first direction, and the subpixel of the first color has the widest near the center of gravity in the pixel.

2. The pixel array according to claim 1, wherein
each of the subpixels has a structure including a light emitting material on an electrode,
for the first portion and the second portion of the subpixel of the second color and/or the subpixel of the third color, the light emitting material is isolated whereas the electrode is continuous,
in the first portion of the subpixels of the second color and/or the subpixel of the third color and in the second portion of a subpixel of a same color in an adjacent one of the pixels on a side of the first portion in the first direction, the light emitting material is continuous,
in the second portion of the subpixel of the second color and/or the subpixel of the third color and in the first portion of a subpixel of a same color in an adjacent one of the pixels on a side of the second portion in the first direction, the light emitting material is continuous, and
the electrode is isolated for each pixel.

3. The pixel array according to claim 1, wherein
the subpixel of the first color has such a shape that a distance to the first portion and the second portion of the subpixel of the second color and the subpixel of the third color is substantially constant.

4. The pixel array according to claim 1, wherein
the first portion and the second portion of the subpixel of the second color and/or the subpixel of the third color are isolated in the pixel.

5. The pixel array according to claim 1, wherein
the subpixel of the first color, the subpixel of the second color and the subpixel of the third color are axisymmetric with respect to a center line which passes the center of gravity of the pixel and extends in the second direction.

6. The pixel array according to claim 1, wherein
the first color is green (G), the second color is red (R), and the third color is blue (B).

7. An electro optical device, comprising:
the pixel array according to claim 1; and
a circuit part driving the pixel array.

8. An electric apparatus, comprising, as a display device, an organic electroluminescence device in which the pixel array according to claim 1 including an organic electroluminescence element and a circuit part driving the pixel array are formed on a flexible substrate.

9. A metal mask used in formation of a pixel array on a substrate, wherein
the pixel array is so configured that rectangular pixels, each enclosing a subpixel of a first color which has a highest luminosity factor, a subpixel of a second color and a subpixel of a third color which has a lowest luminosity factor, are two-dimensionally arranged,
the subpixel of the second color includes a first portion and a second portion separated from each other and located respectively near two corners adjacent to each other in a first direction of the rectangular pixels, the subpixel of the third color includes a first portion and a second portion separated from each other and located near other two corners adjacent to each other in the first direction of the rectangular pixel, and the subpixel of the first color is located at a middle part including a center of gravity in the rectangular pixel,
the metal mask for forming a film of a light emitting material of the first color has an aperture corresponding to each subpixel of the first color, and
the metal mask for forming a film of a light emitting material of the second color and/or the third color has one aperture for the first portion of the subpixel of the second color and/or the first portion of the subpixel of the third color and for the second portion of a subpixel of a same color in an adjacent one of the pixels on a side of the first portion in the first direction, and has one aperture for the second portion of the subpixel of the second color and/or the second portion of the subpixel of the third color and for the first portion of a subpixel of a same color in an adjacent one of the pixels on a side of the second portion in the first direction.

10. The metal mask according to claim 9, wherein
the first color is green (G), the second color is red (R) and the third color is blue (B).

* * * * *